(12) United States Patent
Huang et al.

(10) Patent No.: US 10,170,307 B1
(45) Date of Patent: Jan. 1, 2019

(54) METHOD FOR PATTERNING SEMICONDUCTOR DEVICE USING MASKING LAYER

(71) Applicant: Taiwan Semiconductor Manufacturing Company, Ltd., Hsinchu (TW)

(72) Inventors: Kuan-Wei Huang, Taoyuan (TW); Yu-Yu Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/665,682

(22) Filed: Aug. 1, 2017

Related U.S. Application Data

(60) Provisional application No. 62/527,728, filed on Jun. 30, 2017.

(51) Int. Cl.
| | |
|---|---|
| *H01L 21/027* | (2006.01) |
| *H01L 21/768* | (2006.01) |
| *H01L 21/3213* | (2006.01) |
| *G03F 7/09* | (2006.01) |
| *H01L 21/28* | (2006.01) |

(52) U.S. Cl.
CPC .......... *H01L 21/0276* (2013.01); *G03F 7/091* (2013.01); *H01L 21/027* (2013.01); *H01L 21/28035* (2013.01); *H01L 21/28061* (2013.01); *H01L 21/3213* (2013.01); *H01L 21/76802* (2013.01)

(58) Field of Classification Search
CPC ............. H01L 21/0337; H01L 21/0332; H01L 21/0338; H01L 21/0237; H01L 21/31144; H01L 21/3086; H01L 21/3083; H01L 21/3088; H01L 21/30604; H01L 21/32139; H01L 21/768
See application file for complete search history.

(56) References Cited

U.S. PATENT DOCUMENTS

| | | | |
|---|---|---|---|
| 7,972,957 B2 * | 7/2011 | Ho ....................... | H01L 21/0274 438/622 |
| 2014/0342553 A1 * | 11/2014 | Chen ................. | H01L 21/76897 438/666 |
| 2015/0155171 A1 * | 6/2015 | Chang ................. | H01L 21/0338 438/703 |
| 2016/0233104 A1 * | 8/2016 | Kim .................... | H01L 21/3086 |
| 2017/0213724 A1 * | 7/2017 | Yoon ................... | H01L 21/0337 |

* cited by examiner

*Primary Examiner* — Eduardo A Rodela
*Assistant Examiner* — Nilufa Rahim
(74) *Attorney, Agent, or Firm* — Slater Matsil, LLP

(57) ABSTRACT

A semiconductor device and method includes a method. The method includes patterning a plurality of first mandrels over a first mask layer. The method further includes forming a first spacer layer on sidewalls and tops of the first mandrels. The method further includes removing horizontal portions of the first spacer layer, with remaining vertical portions of the first spacer layer forming first spacers. The method further includes, after removing the horizontal portions of the first spacer layer, depositing a reverse material between the first spacers. The method further includes patterning the first mask layer using the first spacers and the reverse material in combination as a first etching mask.

20 Claims, 39 Drawing Sheets

METHOD FOR PATTERNING SEMICONDUCTOR DEVICE USING MASKING LAYER

PRIORITY CLAIM

This application claims the benefit of U.S. Provisional Application No. 62/527,728, filed Jun. 30, 2017, and entitled "Semiconductor Device and Method," which application is hereby incorporated herein by reference.

BACKGROUND

With the increasing down-scaling of semiconductor devices, various processing techniques, such as, photolithography are adapted to allow for the manufacture of devices with increasingly smaller dimensions. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
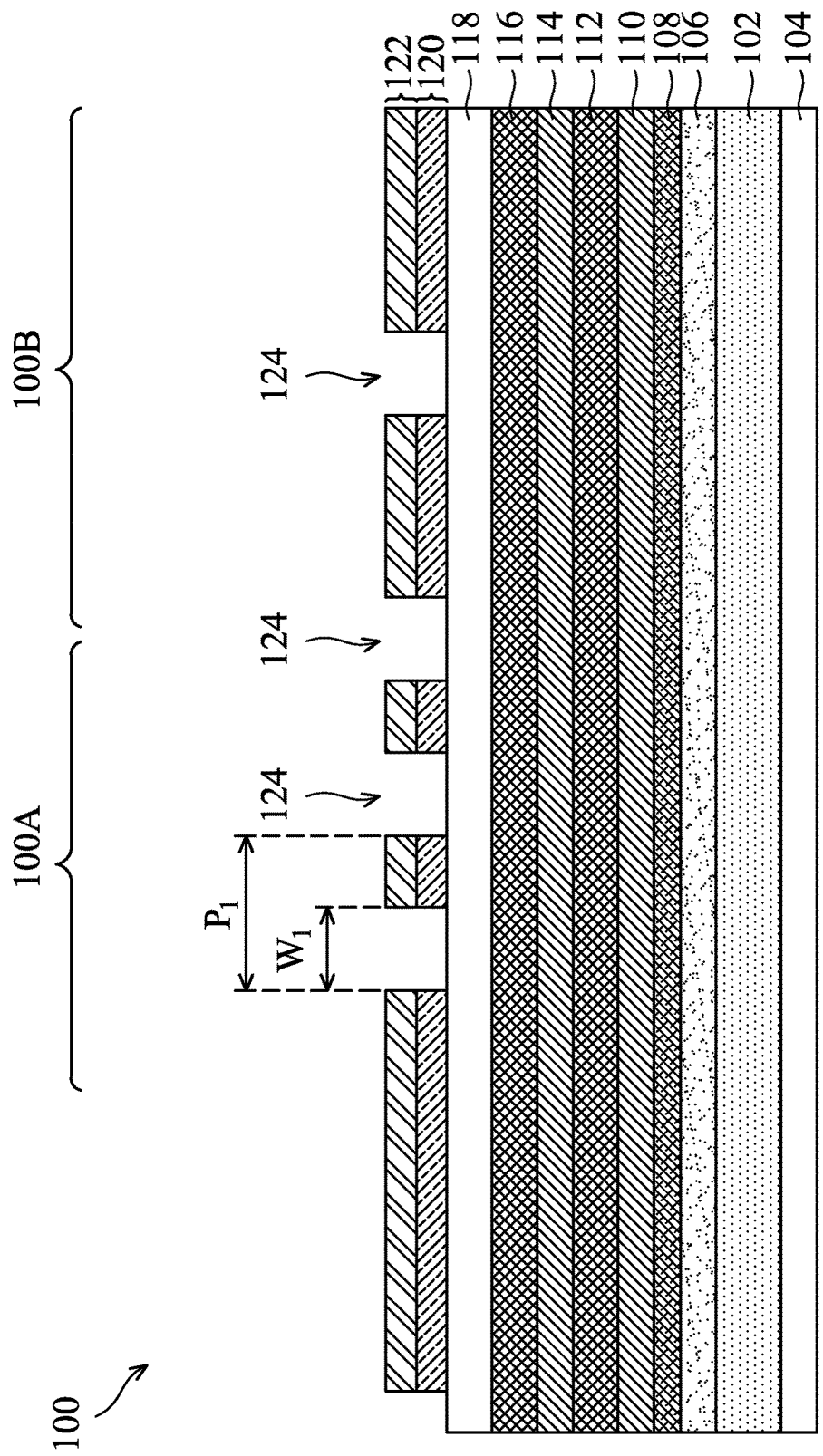
FIGS. 1 through 13 illustrate cross-sectional views of intermediate stages in the formation of features in a target layer on a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method are provided, in accordance with some embodiments. In particular, a self-aligned quadruple patterning process is performed to pattern lines on a substrate. The patterned lines have a pitch that is one quarter of the minimum photolithographic pitch. First patterned lines are formed, second patterned lines are formed between the first patterned lines, and third patterned lines are formed between the first and second patterned lines. After the formation of the line patterns is completed, a mask layer is formed over the line patterns. A tri-layer photoresist is used to pattern the mask layer with a cut pattern for the line patterns. The cut pattern is then transferred to the line patterns. The cut line patterns are used as a mask to pattern an underlying target layer. The underlying target layer may be a layer used for a variety of purposes. For example, the target layer may be a low-k dielectric layer for the formation of interconnect lines. Alternatively, the target layer may be a semiconductor substrate, and the pattern may correspond to semiconductor fins formed on the substrate. Cutting the line patterns after all of the line patterns are formed may reduce the complexity involved with cutting the line patterns during intermediate stages of patterning the lines, and may simplify BEOL processing. Further, cutting the line patterns after all of the line patterns are formed may reduce the amount of defects that may be formed during cutting.

FIGS. 1 through 13 illustrate cross-sectional views of intermediate stages in the formation of features in a target layer 102 on a wafer 100, in accordance with some exemplary embodiments. The target layer 102 is a layer that is to be etched in a self-aligned quadruple patterning (SAQP) process, and in which a plurality of patterns is to be formed, in accordance with embodiments of the present disclosure.

The wafer 100 may have several regions. For example, the example embodiments shown illustrate a first region 100A and a second region 100B. The different regions may be processed to have different pitches between the formed features. In particular, some regions may be processed to form features that are one quarter of the minimum photolithographic pitch in size, and other regions may form features that are larger in size. In the embodiments shown, a pattern in the first region 100A is formed at one quarter of a minimum photolithographic pitch, and a pattern in the second region 100B is formed at a different pitch that may or may not be a fraction of the minimum photolithographic pitch.

In some embodiments, the target layer 102 is an intermetal dielectric (IMD) layer. In such embodiments, the IMD layer may be formed over a substrate that includes active devices, and conductive features such as copper lines, copper vias, and/or cobalt plugs may be formed in the IMD layer. The IMD layer may be formed of a dielectric material having a dielectric constant (k value) lower than 3.8, lower than about 3.0, or lower than about 2.5, for example. In alternative embodiments, the IMD layer is a high-k dielectric layer having a k value higher than 3.8. The IMD layer may be patterned with the SAQP process, and the subsequent process steps may be used to form metal lines and/or vias in the IMD layer.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with the SAQP process, and the subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs) on the wafer 100.

In FIG. 1, a film stack including the target layer 102 is formed. The target layer 102 may be formed on an etch stop layer 104, and may act as a stop for an etching process subsequently performed on the target layer 102. The material and process used to form the etch stop layer 104 may depend on the material of the target layer 102. In some embodiments, the etch stop layer 104 may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like. The etch stop layer 104 is optional; in embodiments where the target layer 102 is a semiconductor substrate used to form finFETs, the etch stop layer 104 may be omitted.

The film stack further includes an anti-reflective coating (ARC) 106 formed on the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). The ARC 106 may be formed by Plasma Enhance Chemical Vapor Deposition (PECVD), High-Density Plasma (HDP) deposition, or the like.

The film stack further includes a hard mask layer 108 formed on the ARC 106. The hard mask layer 108 may be formed of a material that comprises a metal, such as titanium nitride, titanium, tantalum nitride, tantalum, or the like, and may be formed by PVD, Radio Frequency PVD (RFPVD), Atomic Layer Deposition (ALD), or the like. The hard mask layer 108 may also be formed of a non-metallic material, such as SiN. The material of the hard mask layer 108 is selective to the target layer 102 relative a same etching process. In subsequent processing steps, a pattern is formed on the hard mask layer 108 using a SAQP process. The hard mask layer 108 is then used as an etching mask, where the pattern of the hard mask layer 108 is transferred to the target layer 102.

The film stack further includes a first dielectric hard mask layer 110 formed on the hard mask layer 108. The first dielectric hard mask layer 110 may be formed from a silicon oxide, such as borophosphosilicate tetraethylorthosilicate (BPTEOS) or undoped tetraethylorthosilicate (TEOS) oxide, and may be formed by CVD, ALD, spin-on coating, or the like. The first dielectric hard mask layer 110 acts as an etch stop layer during etching of the first mandrel layer 112. In some embodiments, the first dielectric hard mask layer 110 also acts as an anti-reflective coating.

The film stack further includes a first mandrel layer 112 formed on the first dielectric hard mask layer 110. The first mandrel layer 112 may be formed of a semiconductor such as amorphous silicon, or another material that has a high etching selectivity with the underlying layer, e.g., with the first dielectric hard mask layer 110.

The film stack further includes a second dielectric hard mask layer 114 formed on the first mandrel layer 112. The second dielectric hard mask layer 114 may be formed of a material selected from the same candidate material of the first dielectric hard mask layer 110, and may be formed using a method that is selected from the same group of candidate methods for forming the first dielectric hard mask layer 110. The first dielectric hard mask layer 110 and second dielectric hard mask layer 114 may be formed of the same material, or may include different materials. The second dielectric hard mask layer 114 is formed of a material that has a high etching selectivity with the first mandrel layer 112.

The film stack further includes a second mandrel layer 116 formed on the second dielectric hard mask layer 114. The second mandrel layer 116 may be formed of a material selected from the same candidate material of the first mandrel layer 112, and may be formed using a method that is selected from the same group of candidate methods for forming the first mandrel layer 112. The first mandrel layer 112 and second mandrel layer 116 may be formed of the same material, or may include different materials. The second mandrel layer 116 is formed of a material that has a high etching selectivity with the second dielectric hard mask layer 114.

Further in FIG. 1, a tri-layer photoresist is formed on the film stack. The tri-layer photoresist includes a bottom layer 118, a middle layer 120 over the bottom layer 118, and an upper layer 122 over the middle layer 120. The bottom layer 118 and upper layer 122 may be formed of photoresists, which include organic materials. The bottom layer 118 may be a bottom anti-reflective coating (BARC). The middle layer 120 may be formed of or include an inorganic material, which may be a nitride (such as silicon nitride), an oxynitride (such as silicon oxynitride), an oxide (such as silicon oxide), or the like. The upper layer 122 is a photosensitive material. The middle layer 120 has a high etching selectivity relative to the upper layer 122 and the bottom layer 118. As a result, the upper layer 122 is used as an etching mask for the patterning of the middle layer 120, and the middle layer 120 is used as an etching mask for the patterning of the bottom layer 118.

The upper layer 122 is patterned using any suitable photolithography technique to form openings 124 therein. The openings 124 may have strip shapes in a plan view. The pitch $P_1$ of the openings 124 in the first region 100A may be about three times the width $W_1$ of the openings 124. In an embodiment, the pitch $P_1$ of the openings 124 is about 108 nm. Throughout the description, the patterns of openings 124 may also be referred to as "line-A" patterns.

As an example of patterning the upper layer 122, a photomask (not shown) may be disposed over the upper layer 122, which may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the top photoresist layer may be performed using an immersion lithography system to increase resolution and decrease the minimum achievable pitch. A bake or cure operation may be performed to harden the upper layer 122, and a developer may be used to remove either the exposed or unexposed portions of the upper layer 122 depending on whether a positive or negative resist is used.

After the patterning of the upper layer 122, the pattern of the upper layer 122 is transferred to the middle layer 120 in an etching process. The etching process is anisotropic, so that the openings 124 in the upper layer 122 are extended through the middle layer 120, and have about the same sizes in the middle layer 120 as they do in the upper layer 122.

Figure 2:
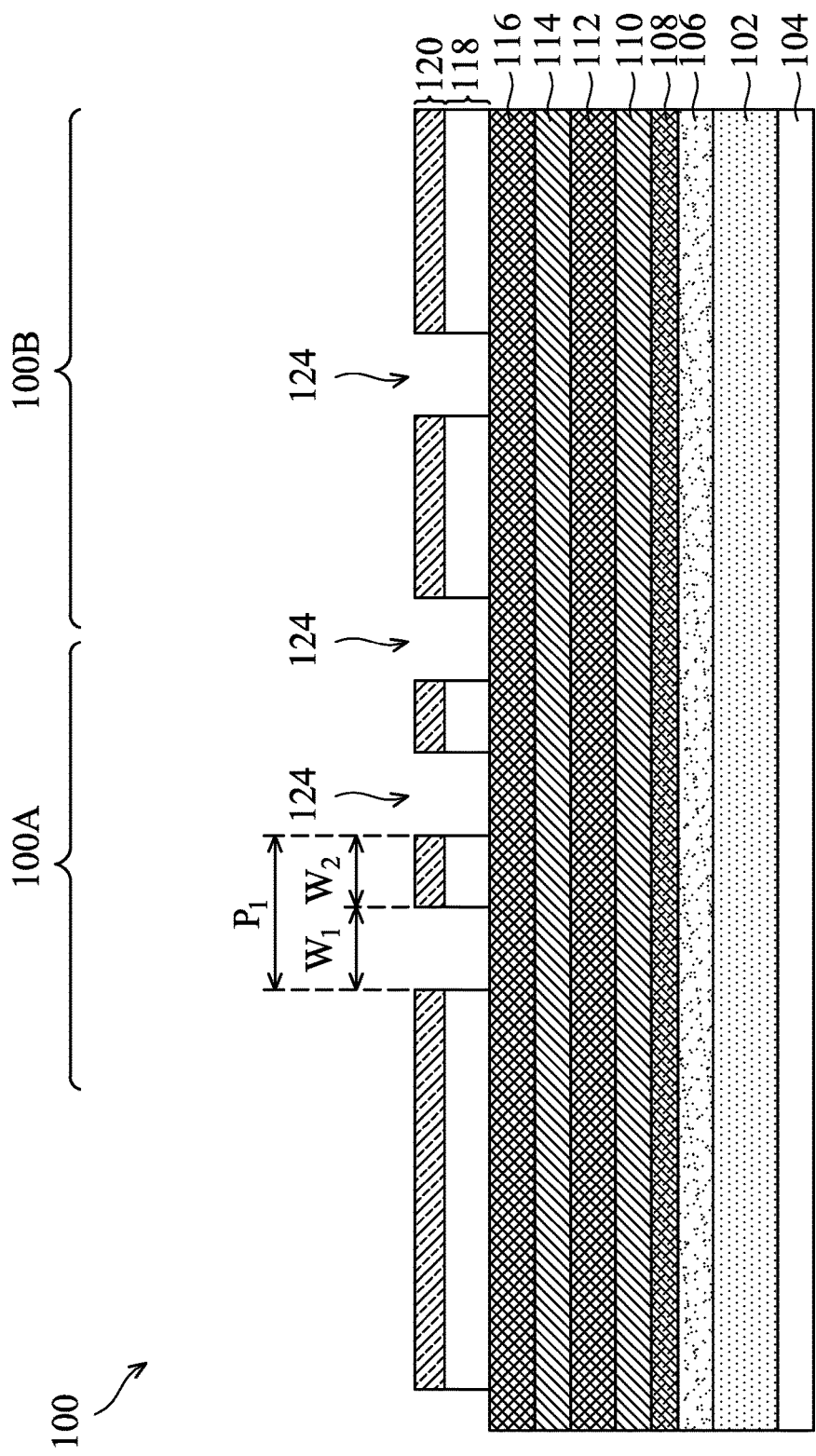

In FIG. 2, a trimming process is performed to increase the size of the openings 124 in the middle layer 120. In an embodiment, the trimming process is an anisotropic plasma etch process with process gases including $O_2$, $CO_2$, $N_2/H_2$, $H_2$, the like, a combination thereof, or any other gases suitable for trimming the middle layer 120. The trimming may increase the width $W_1$ of the openings 124 and decrease the width $W_2$ of the portions of the middle layer 120 between the openings 124. After the trimming, the ratio of the width $W_1$ to the width $W_2$ in the first region 100A may be about 5:3. In an embodiment, after the trimming, the width $W_1$ of the openings 124 in the first region 100A is about 67.5 nm, and the width $W_2$ of the portions of the middle layer 120 in the first region 100A is about 40.5 nm. After the trimming process, a first mandrel etching process is performed to transfer the pattern of the middle layer 120 to the bottom layer 118, thereby extending the openings 124 through the bottom layer 118.

Figure 3:
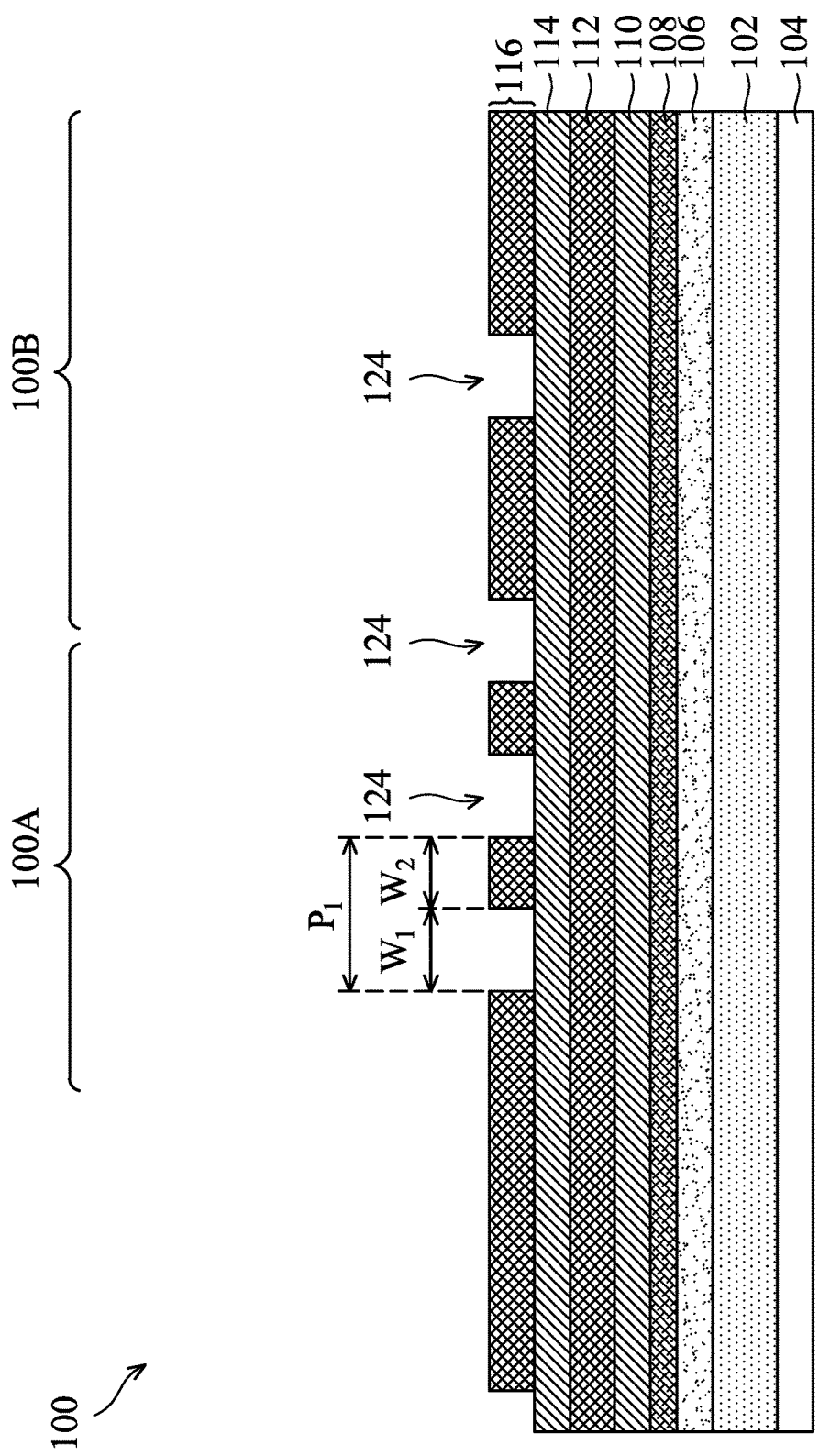

In FIG. 3, the first mandrel etching process is continued to transfer the pattern of the bottom layer 118 to the second mandrel layer 116. During the first mandrel etching process, the upper layer 122, middle layer 120, and bottom layer 118 may be consumed. In some embodiments, an ashing process may be performed to remove remaining residue of the bottom layer 118. The remaining portions of the second mandrel layer 116 are referred to herein as second intermediate mandrels 116. The first mandrel etching process is an anisotropic etch, so that the width of the openings 124 is about equal to the width $W_1$, and the width of the second intermediate mandrels 116 between the openings 124 is about equal to the width $W_2$.

Figure 4:
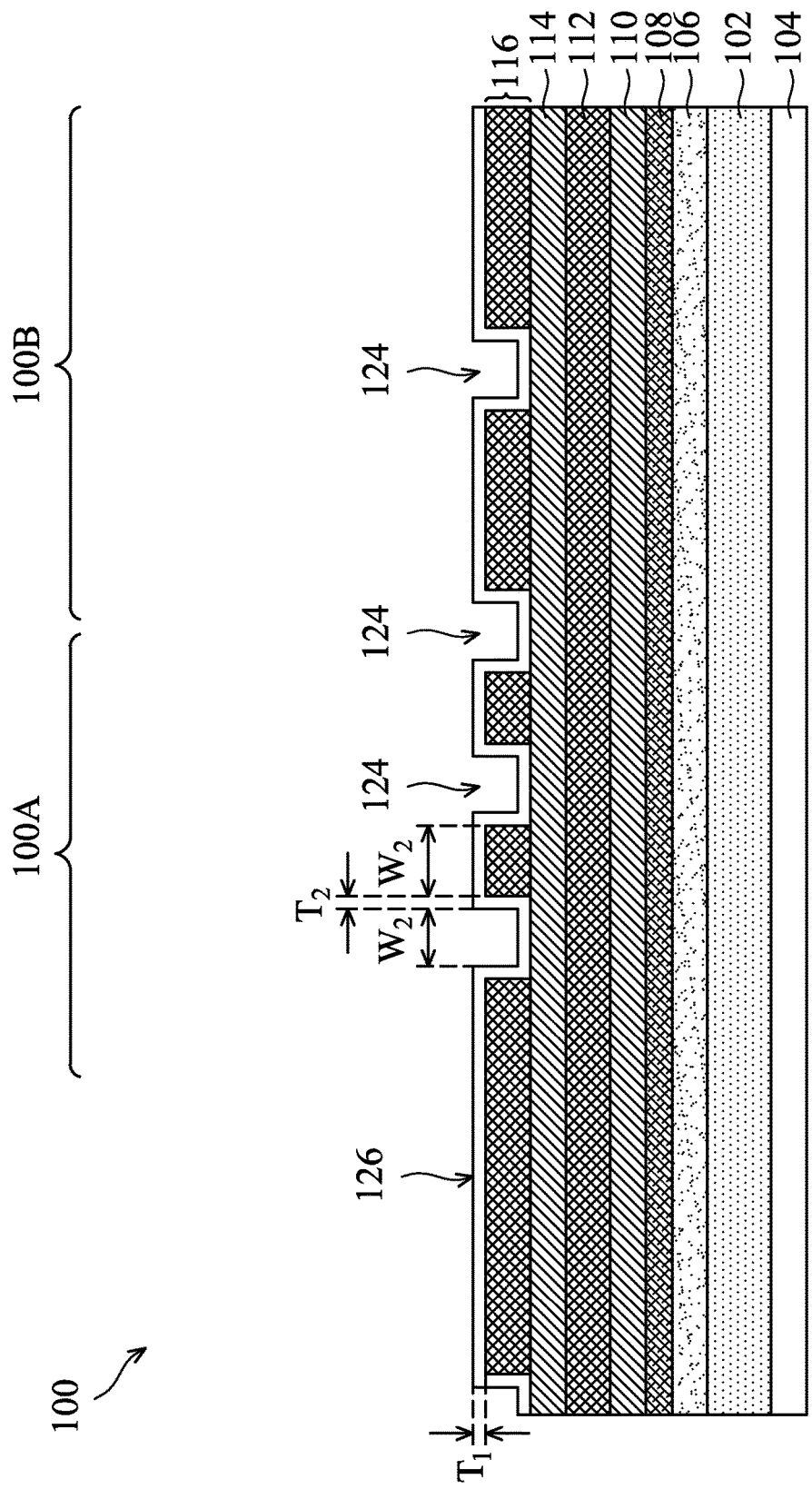

In FIG. 4, a first spacer layer 126 is conformally formed over the wafer 100. After formation the first spacer layer 126 extends along top surfaces and sidewalls of the second intermediate mandrels 116, and top surfaces of the second dielectric hard mask layer 114 in the openings 124. The material of the first spacer layer 126 is selected to have a high etching selectivity with the second dielectric hard mask layer 114. The first spacer layer 126 may be formed from AlO, AlN, AlON, TaN, TiN, TiO, Si, SiO, SiN, metals, metal alloys, and the like, and may be deposited using any suitable process such as ALD, CVD, or the like.

As shown in FIG. 4, the first spacer layer 126 is formed as a conformal layer, with the thickness $T_1$ of its horizontal portions and the thickness $T_2$ of its vertical portions close to each other, for example, with the thicknesses $T_1$ and $T_2$ being within about 20 percent of each other. The first spacer layer 126 is formed to have a thickness $T_2$ such that the width between the sides of the first spacer layer 126 in the openings 124 is about equal to the width $W_2$ of the second intermediate mandrels 116. In other words, the distances between each of the vertical portions of the first spacer layer 126 are about equal. In an embodiment, the first spacer layer 126 is formed to have thicknesses $T_1$ and $T_2$ of about 13.5 nm, and as such, the widths $W_2$ between each vertical portion are about 40.5 nm.

Figure 5:
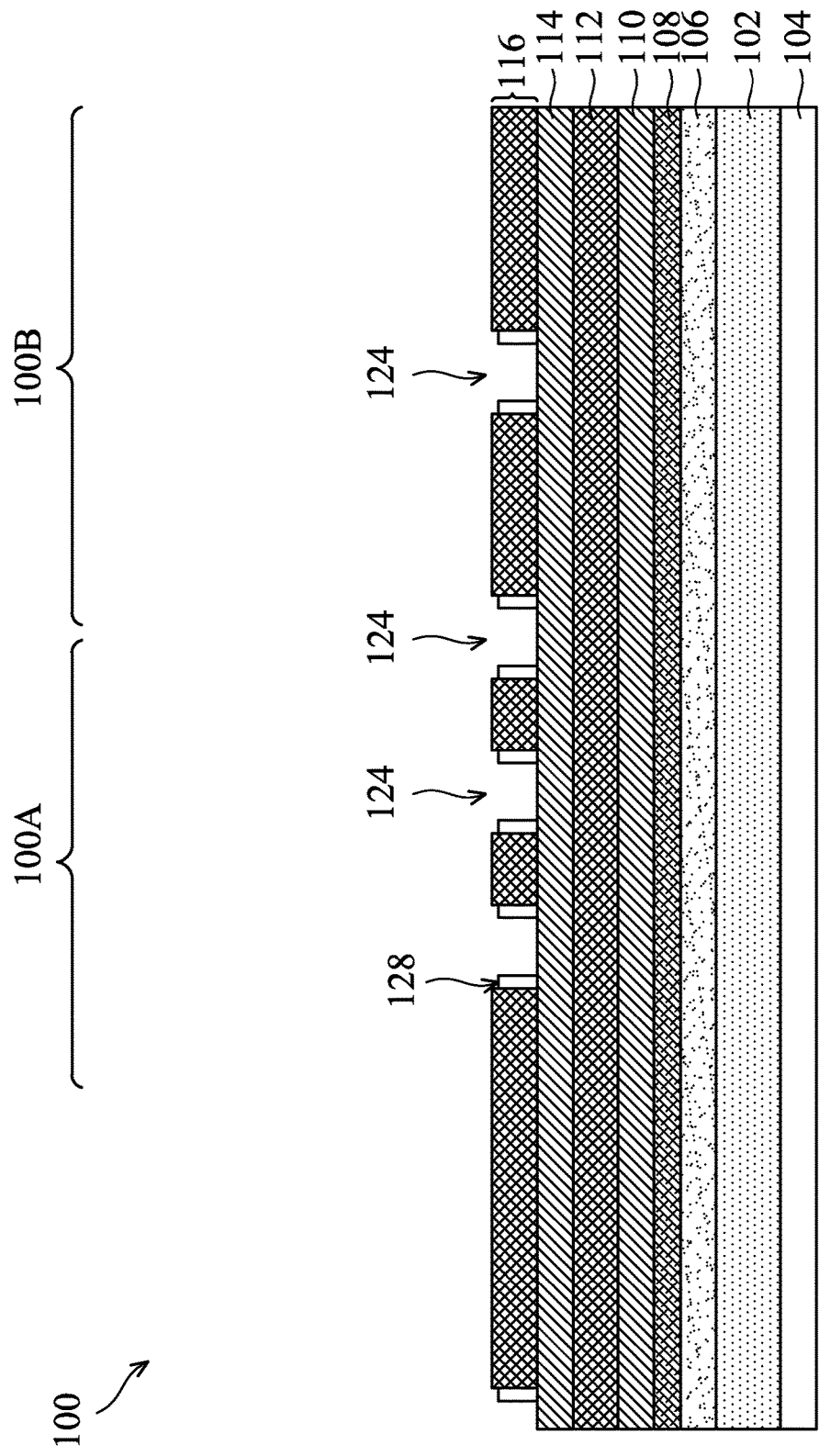

In FIG. 5, an etching process is performed to remove the horizontal portions of the first spacer layer 126. The vertical portions of the first spacer layer 126 remain after the etching, and are referred to as first spacers 128 hereinafter. The etching process is anisotropic, such that the thickness of the first spacers 128 does not change by a significant amount, and is about equal to the thickness $T_2$.

Figure 6:
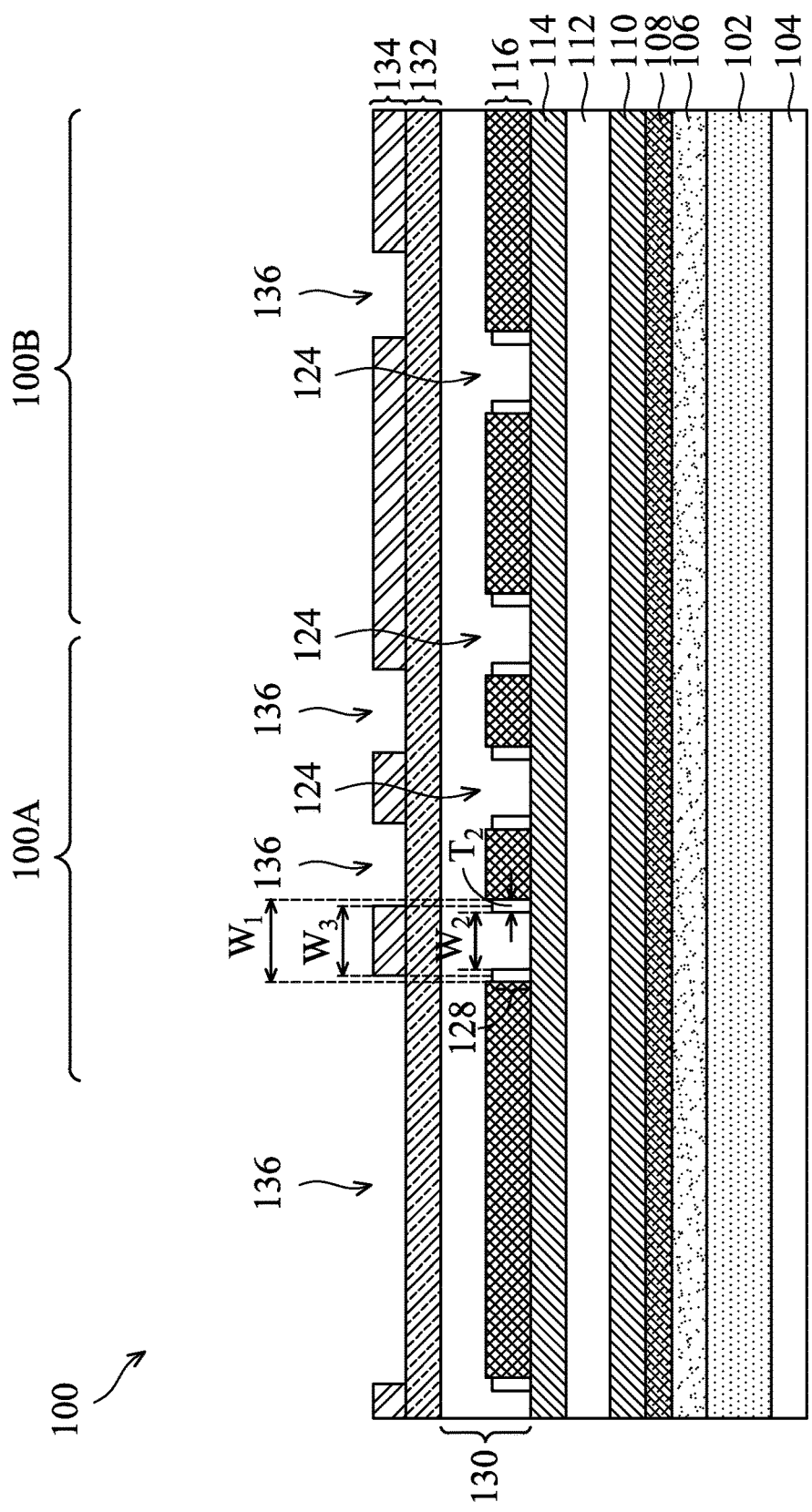

In FIG. 6, a tri-layer photoresist is formed on the device shown in FIG. 5. The tri-layer photoresist includes a bottom layer 130, a middle layer 132 over the bottom layer 130, and an upper layer 134 over the middle layer 132. The material of the bottom layer 130, middle layer 132, and upper layer 134 may be selected from the same candidate materials of the bottom layer 118, middle layer 120, and upper layer 122 shown in FIG. 1, respectively.

The upper layer 134 is patterned using a suitable photolithography technique to form openings 136 therein. The openings 136 are formed over the second intermediate mandrels 116. Portions of the second intermediate mandrels 116 exposed by the pattern of the openings 136 are removed in a subsequent etching process (described below). In an embodiment, the openings 136 are not formed over all of the second intermediate mandrels 116, e.g., they are formed over a subset of the second intermediate mandrels 116. The openings 136 may be formed such that remaining portions of the upper layer 134 in the first region 100A have a width $W_3$ that is greater than the width $W_2$ and less than the width $W_1$. In particular, the width $W_3$ may be greater than the sum of the with $W_2$ and the thickness $T_2$, such that the remaining portions of the upper layer 134 overly the openings 124 and at least half of each of the first spacers 128. In the embodiment where the width $W_1$ is about 67.5 nm, the width $W_2$ is about 40.5 nm, and the thickness $T_2$ is about 13.5 nm, the width $W_3$ in the first region 100A may be about 60 nm (e.g., greater than 54 nm and less than 67.5 nm).

Figure 7:
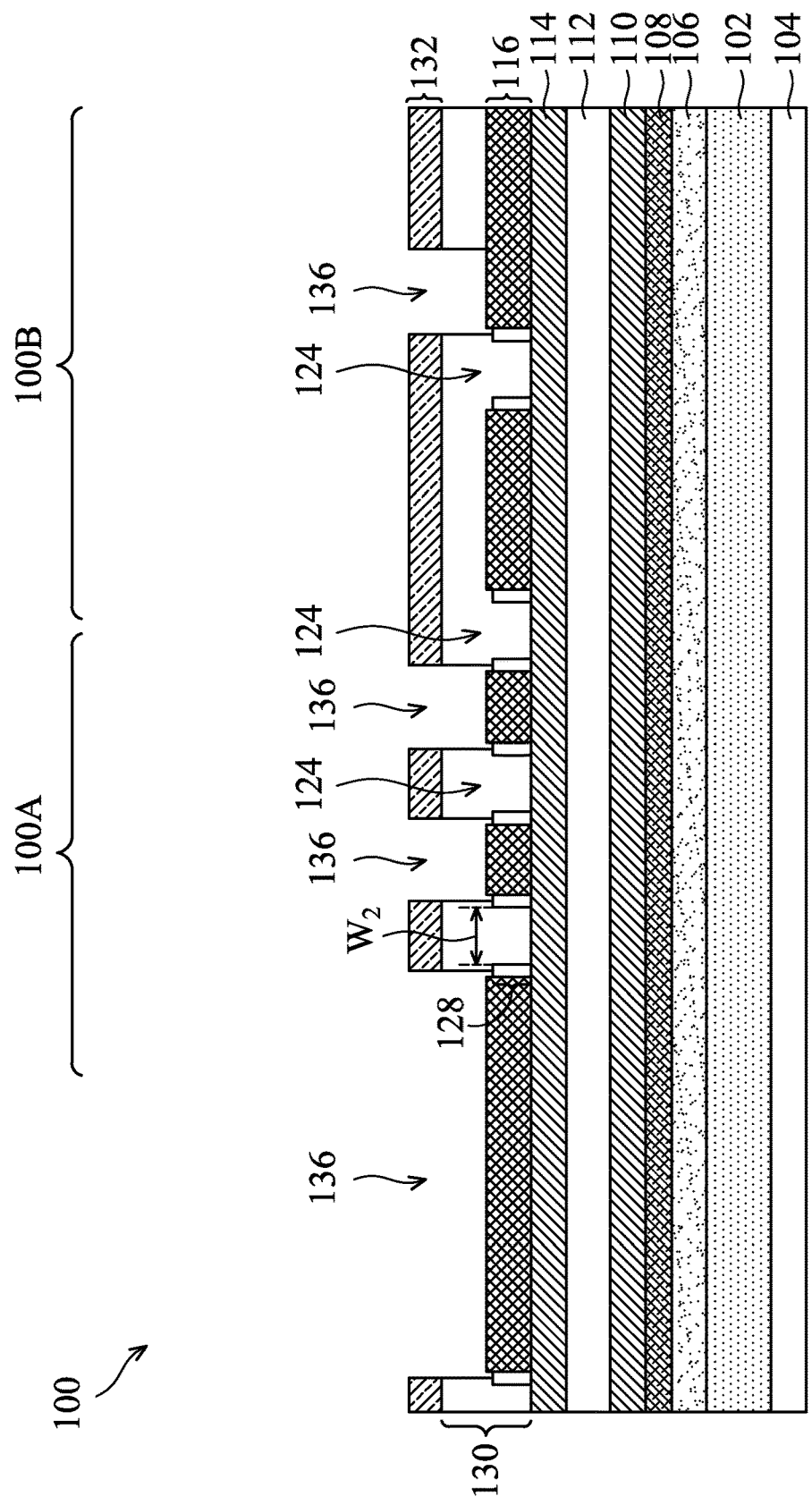

In FIG. 7, a second mandrel etching process is performed to transfer the pattern of the upper layer 134 to the middle layer 132 and the bottom layer 130, thereby extending the openings 136 through the bottom layer 130, exposing the second intermediate mandrels 116 and the first spacers 128. The second mandrel etching process may be an anisotropic etch.

Figure 8:
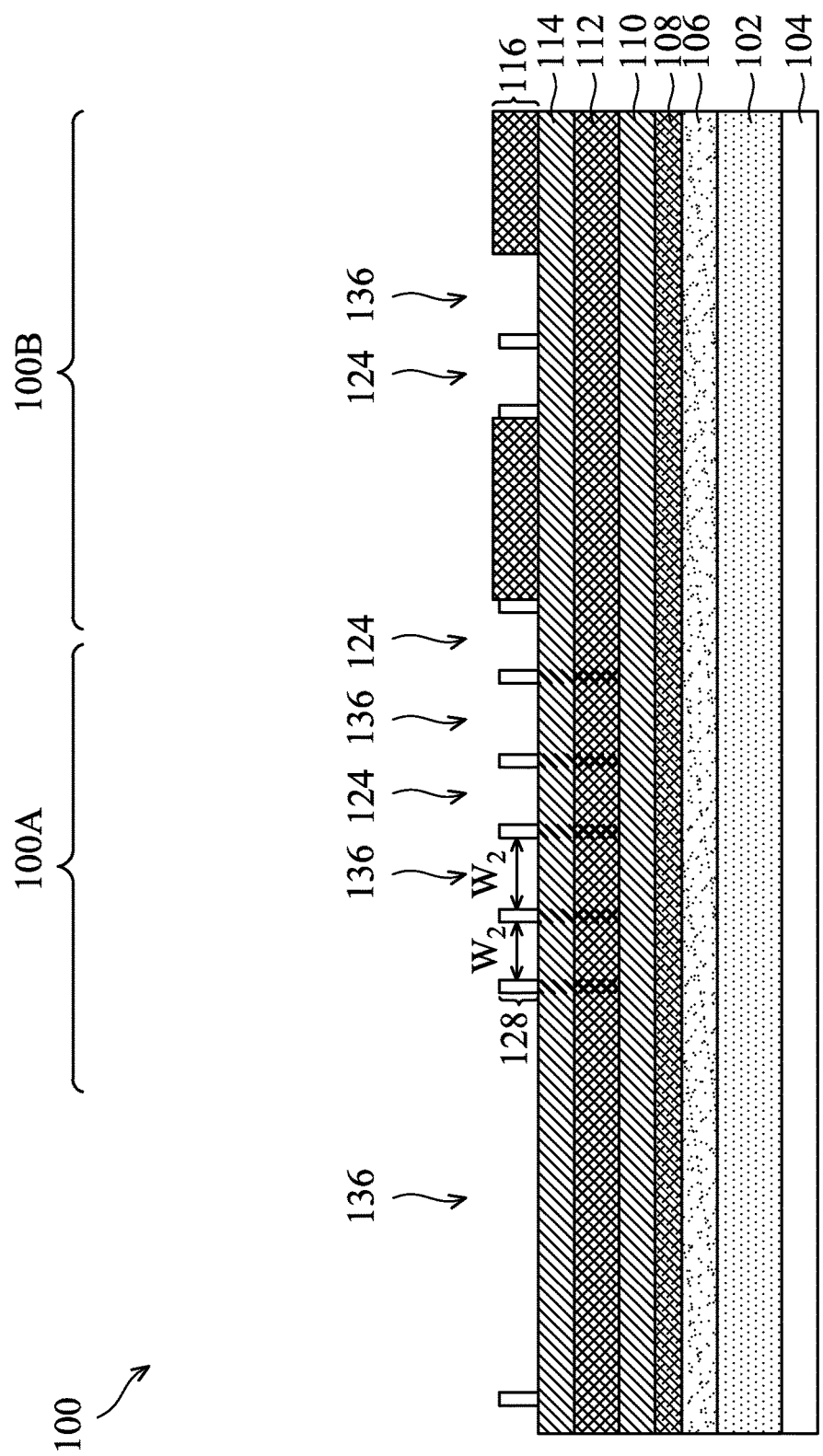

In FIG. 8, the second mandrel etching process is continued to remove portions of the second intermediate mandrels 116 exposed by the openings 136 extending through the bottom layer 130. During the second mandrel etching process, the upper layer 134, middle layer 132, and bottom layer 130 may be consumed. In some embodiments, an ashing process may be performed to remove remaining residue of the bottom layer 130. Throughout the description, the patterns of openings 136 may also be referred to as "line-B" patterns. In an embodiment, the pattern of the bottom layer 130 exposes all of the second intermediate mandrels 116 in the first region 100A, such that, after the second etching, each of the first spacers 128 remain in the first region 100A with no mandrels between them. Further, in some embodiments, the pattern of the bottom layer 130 may only partially expose some of the second intermediate mandrels 116 in the second region 100B.

Figure 9:
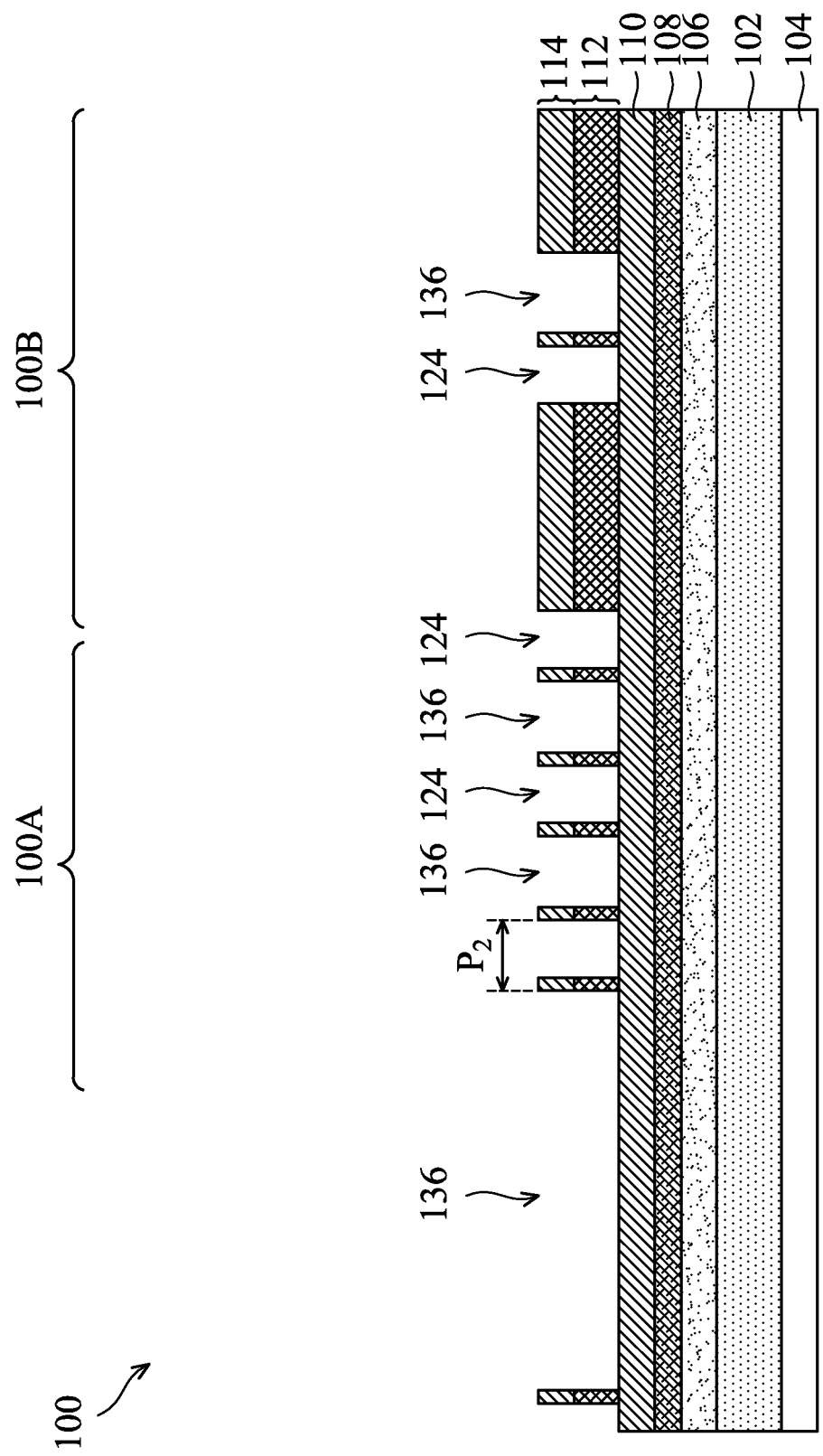

In FIG. 9, the first spacers 128 and the remaining portions of the second intermediate mandrels 116 are in combination used as an etching mask to etch the second dielectric hard mask layer 114 and the first mandrel layer 112 in a third mandrel etching process. The openings 124 and the openings 136 extend into and remove portions of the first mandrel layer 112 and the second dielectric hard mask layer 114. The remaining portions of the first mandrel layer 112 are referred to herein as first intermediate mandrels 112, and the remaining portions of the second dielectric hard mask layer 114 are referred to herein as second dielectric caps 114. In the third mandrel etching process, the first spacers 128 and the remaining portions of the second intermediate mandrels 116 may or may not be fully consumed. The third mandrel etching process may be anisotropic. After etching, the pitch $P_2$ of the first mandrel layer 112 in the first region 100A may be equal to about a half of the pitch $P_1$ (see, e.g., FIG. 1).

Figure 10:
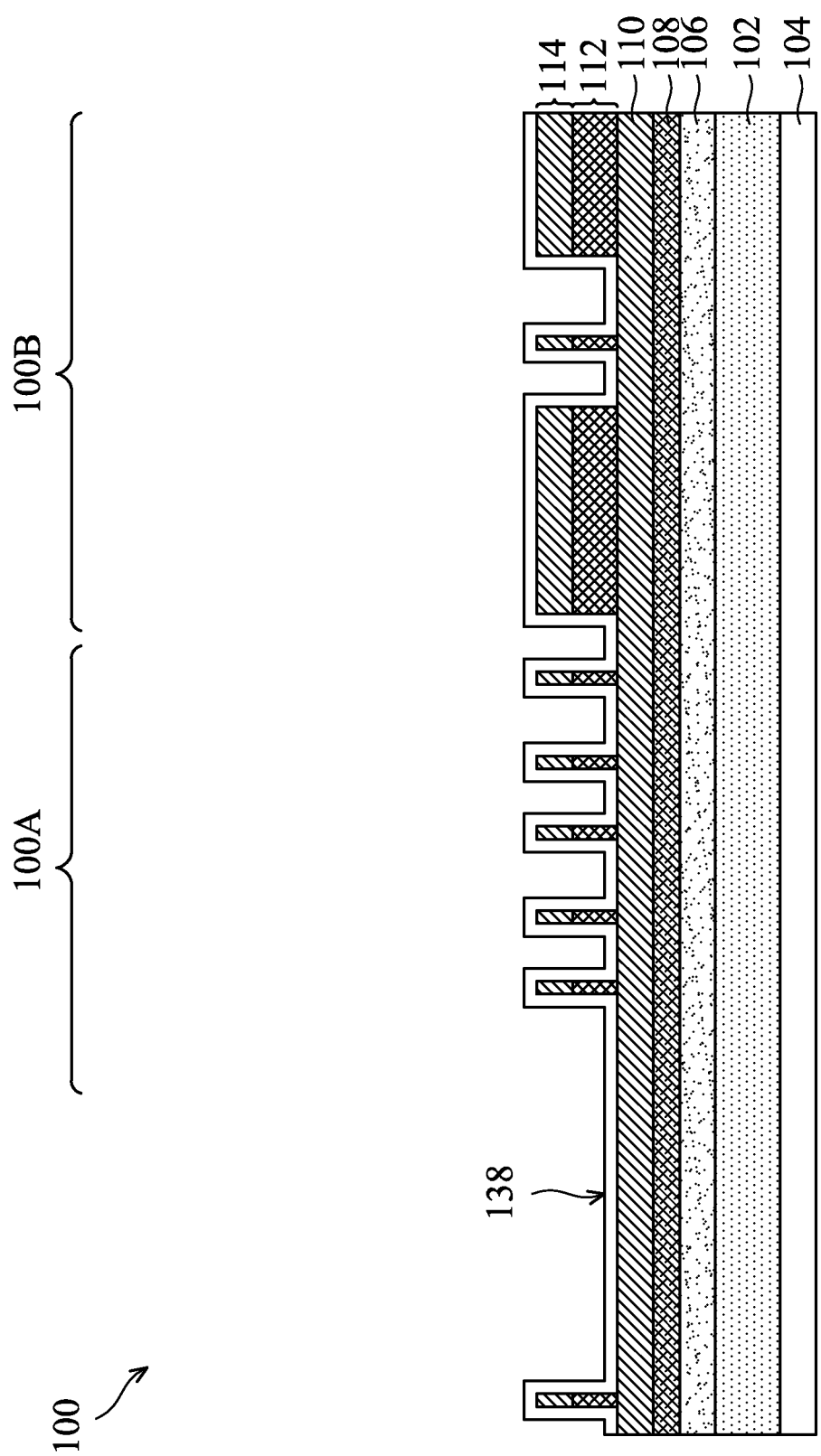

In FIG. 10, a second spacer layer 138 is conformally formed over the wafer 100. After formation, the second spacer layer 138 extends along top surfaces and sidewalls of the second dielectric caps 114, sidewalls of the first intermediate mandrels 112, and top surfaces of the first dielectric hard mask layer 110 in the openings 124 and 136. The material of the second spacer layer 138 is selected to have a high etching selectivity with the first dielectric hard mask layer 110. The second spacer layer 138 may be formed of a material selected from the same candidate material of the first spacer layer 126, and may be formed using a method that is selected from the same group of candidate methods for forming the first spacer layer 126. The first spacer layer 126 and second spacer layer 138 may be formed of the same material, or may include different materials.

Figure 11:
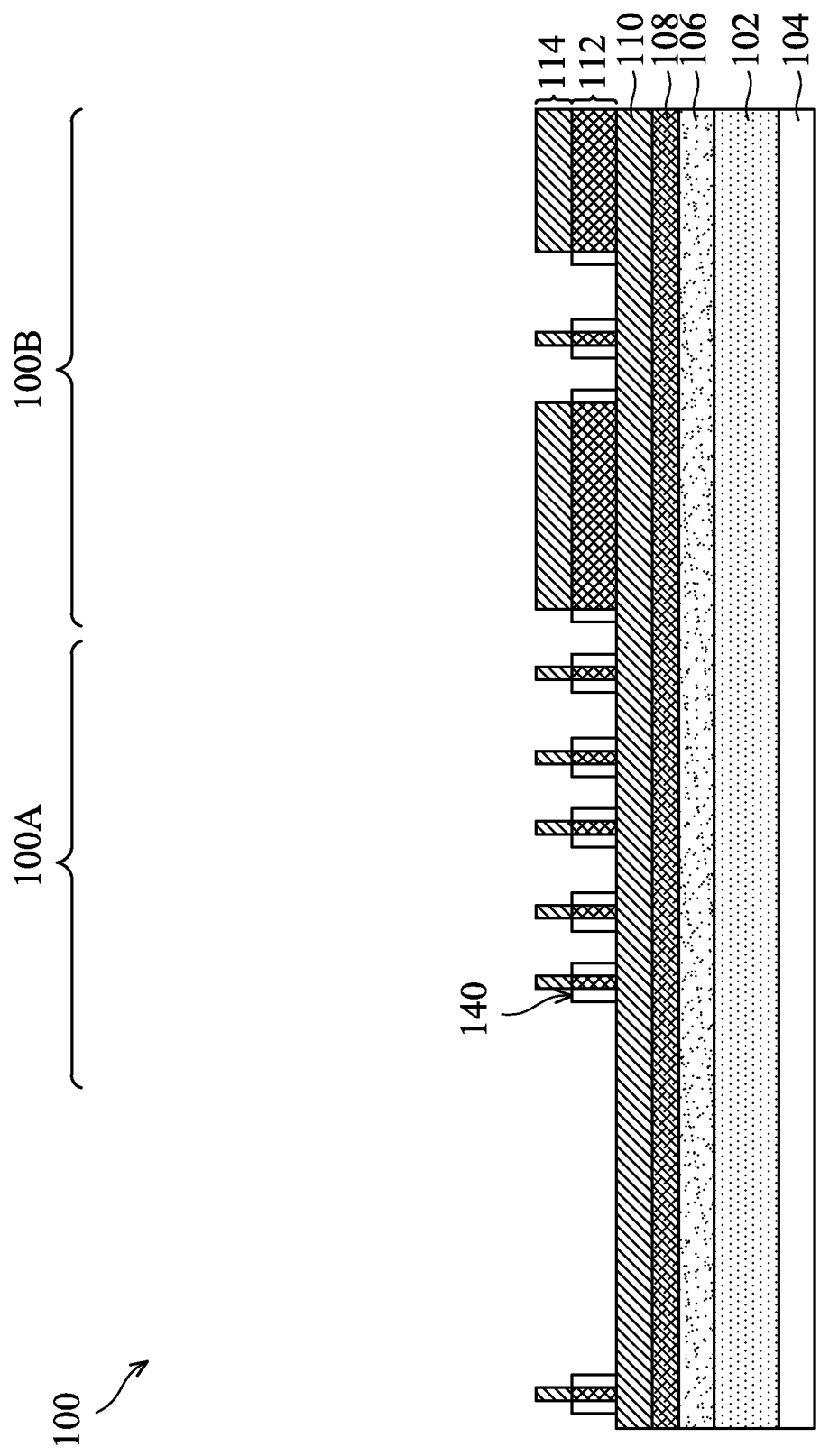

In FIG. 11, an etching process is performed to remove the horizontal portions of the second spacer layer 138. The vertical portions of the second spacer layer 138 remaining after the etching are referred to as second spacers 140 hereinafter. The etching process may also remove some of the vertical portions of the second spacer layer 138. For example, the vertical portions of the second spacer layer 138 extending along the sidewalls of the second dielectric caps 114 may be recessed. The etching process is anisotropic, such that the thickness of the first spacers 128 does not change by a significant amount.

Figure 12:
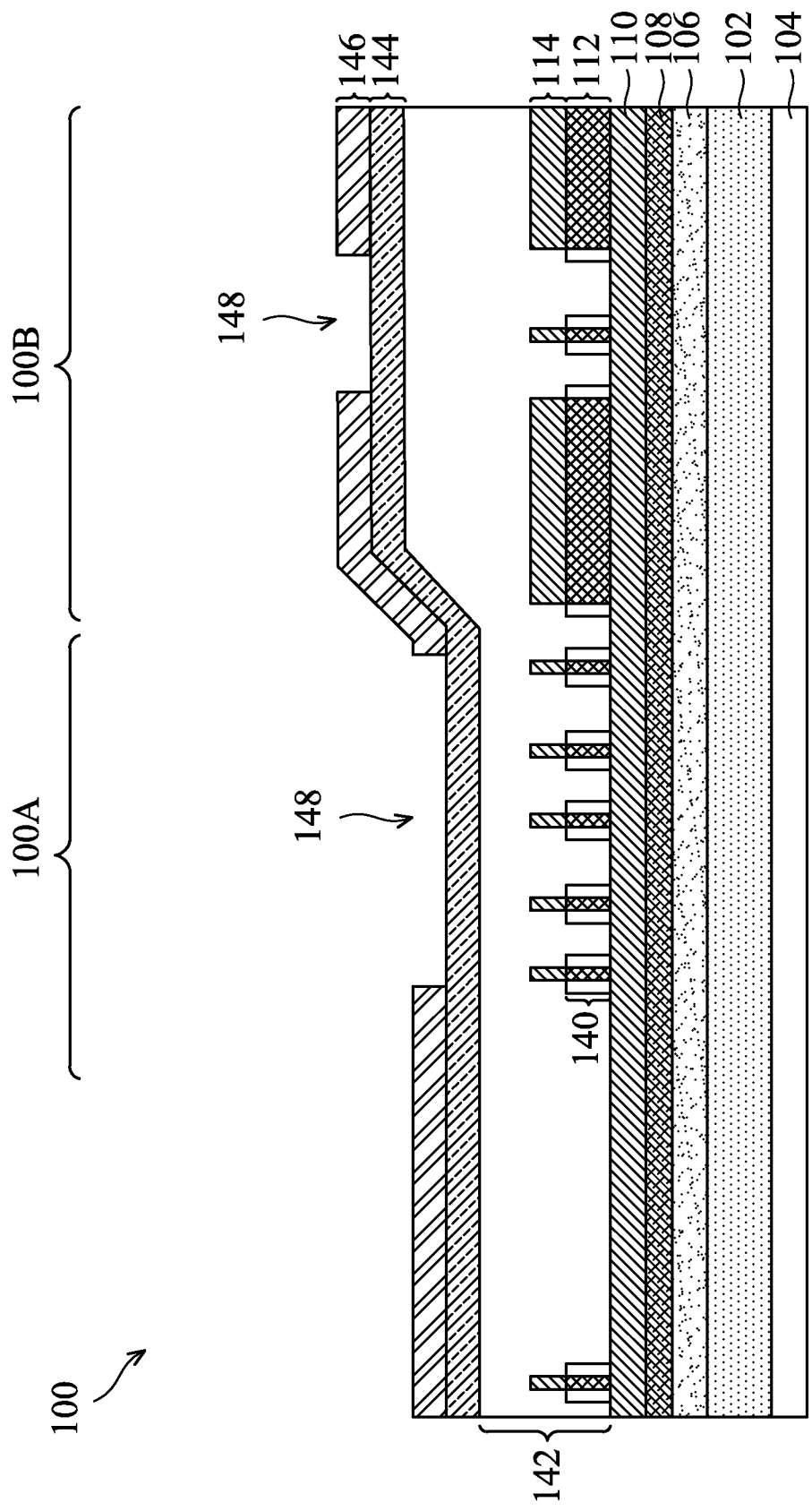

In FIG. 12, a tri-layer photoresist is formed on the device shown in FIG. 11. The tri-layer photoresist includes a bottom layer 142, a middle layer 144 over the bottom layer 142, and an upper layer 146 over the middle layer 144. The material of the bottom layer 142, middle layer 144, and upper layer 146 may be selected from the same candidate materials of the bottom layer 118, middle layer 120, and upper layer 122 shown in FIG. 1, respectively. Because of variations in the underlying feature density, portions of the tri-layer photoresist, such as the bottom layer 142, may be formed over the second region 100B at a greater thickness than the first region 100A. In particular, the thickness over the first region 100A may be less than the second region 100B because the features in the first region 100A are formed more densely.

The upper layer 146 is patterned using a suitable photolithography technique to form openings 148 therein. The openings 148 are formed over the second spacers 140, the first intermediate mandrels 112, and the second dielectric caps 114. In an embodiment, the openings 148 are not formed over all of the second spacers 140, e.g., they are formed over a subset of the second spacers 140 and the first intermediate mandrels 112.

Figure 13:
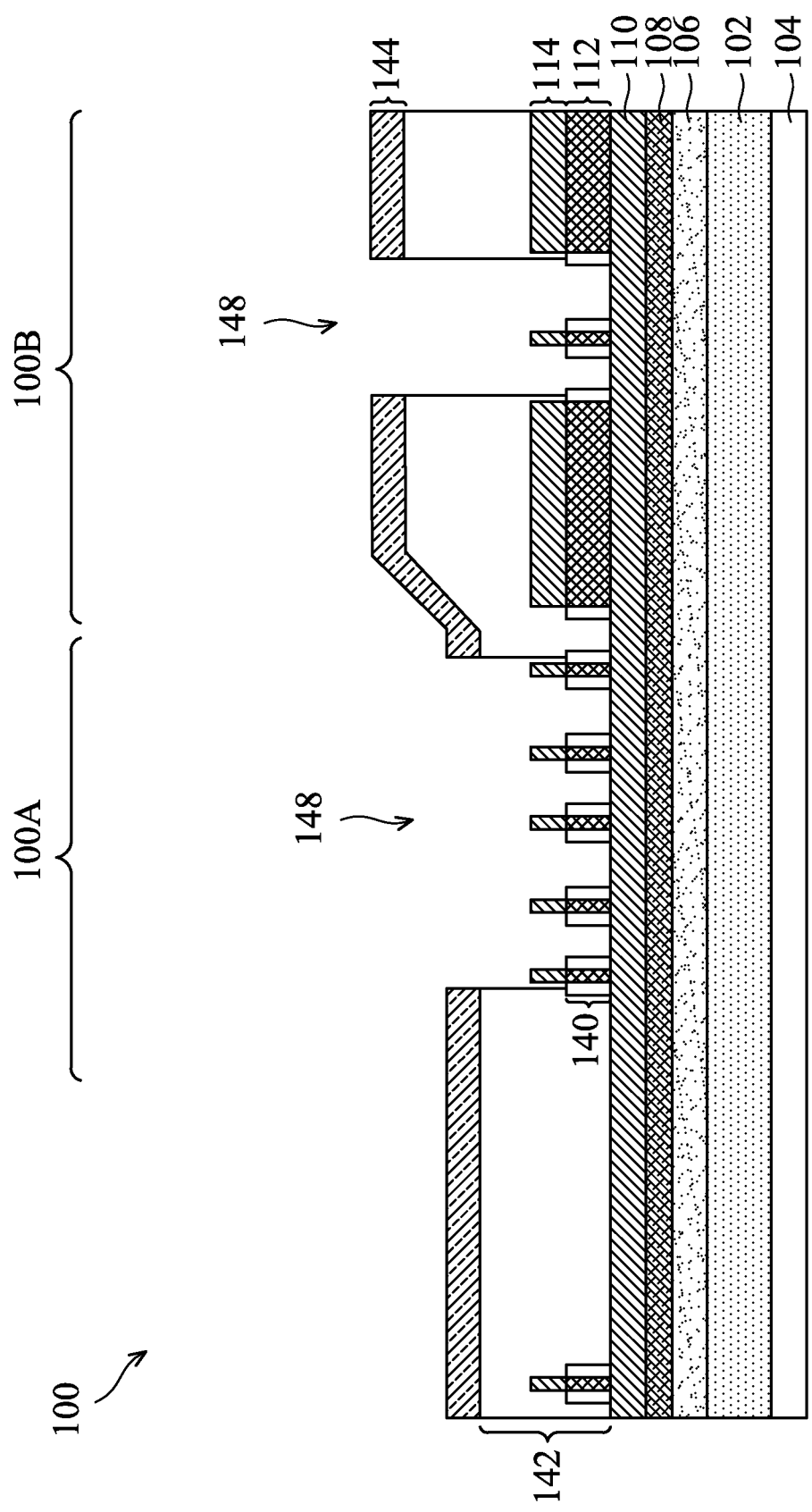

In FIG. 13, a fourth mandrel etching process is performed to transfer the pattern of the upper layer 146 to the middle layer 144 and the bottom layer 142, thereby extending the openings 148 through the bottom layer 142, exposing the first intermediate mandrels 112 and the second spacers 140. The fourth mandrel etching process may be an anisotropic etch.

FIGS. 14A through 22B illustrate perspective views and cross-sectional views of further intermediate stages in the formation of the features in the target layer, in accordance with some exemplary embodiments. In FIGS. 14A through 22B, figures ending with an "A" designation are perspective views of the wafer 100, and figures ending with a "B" designation are cross-sectional views shown along a B-B line in the corresponding perspective view.

Figure 14A:
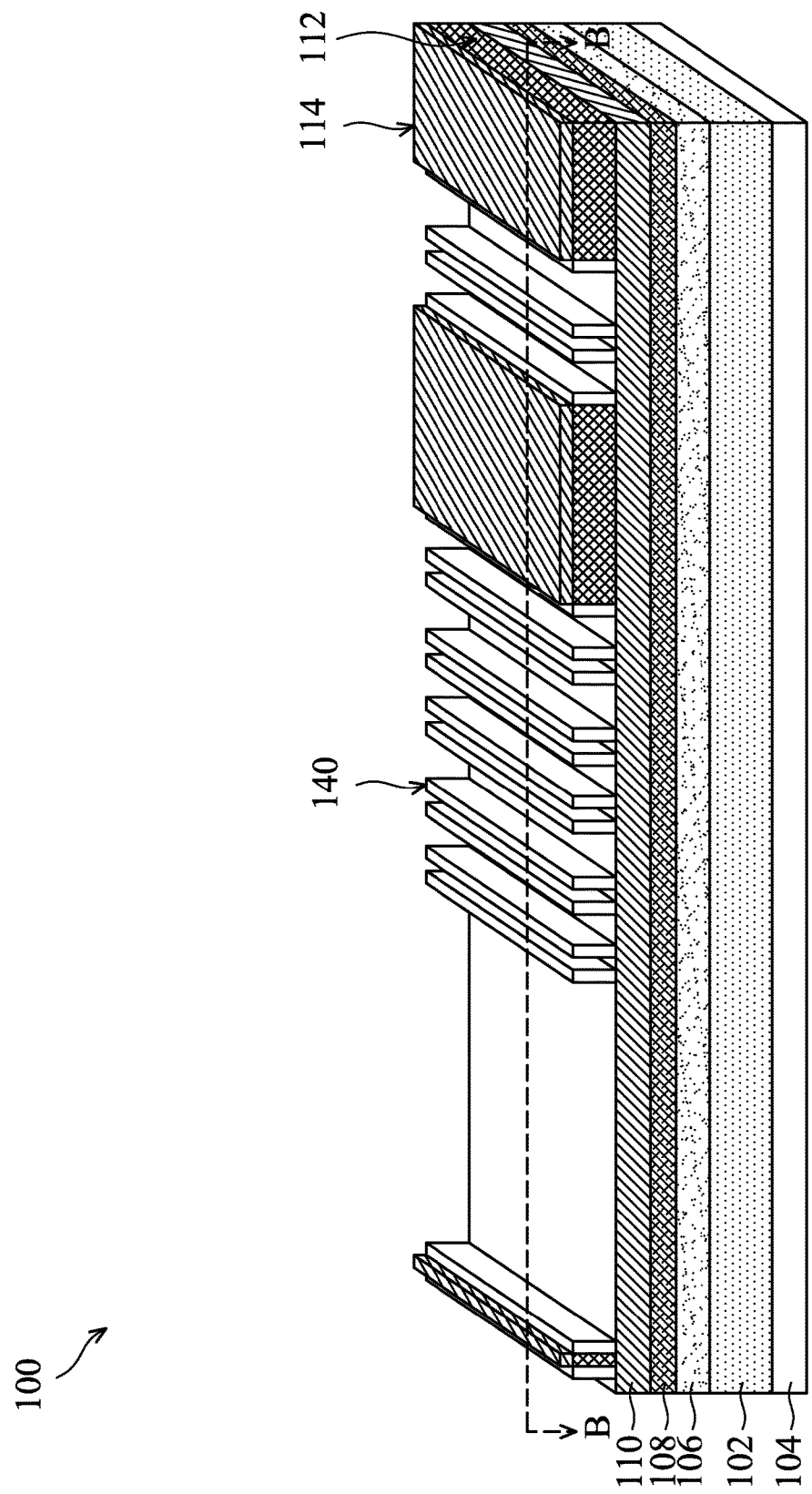
FIGS. 14A through 22B illustrate perspective views and cross-sectional views of further intermediate stages in the formation of the features in the target layer, in accordance with some embodiments.
Figure 14B:
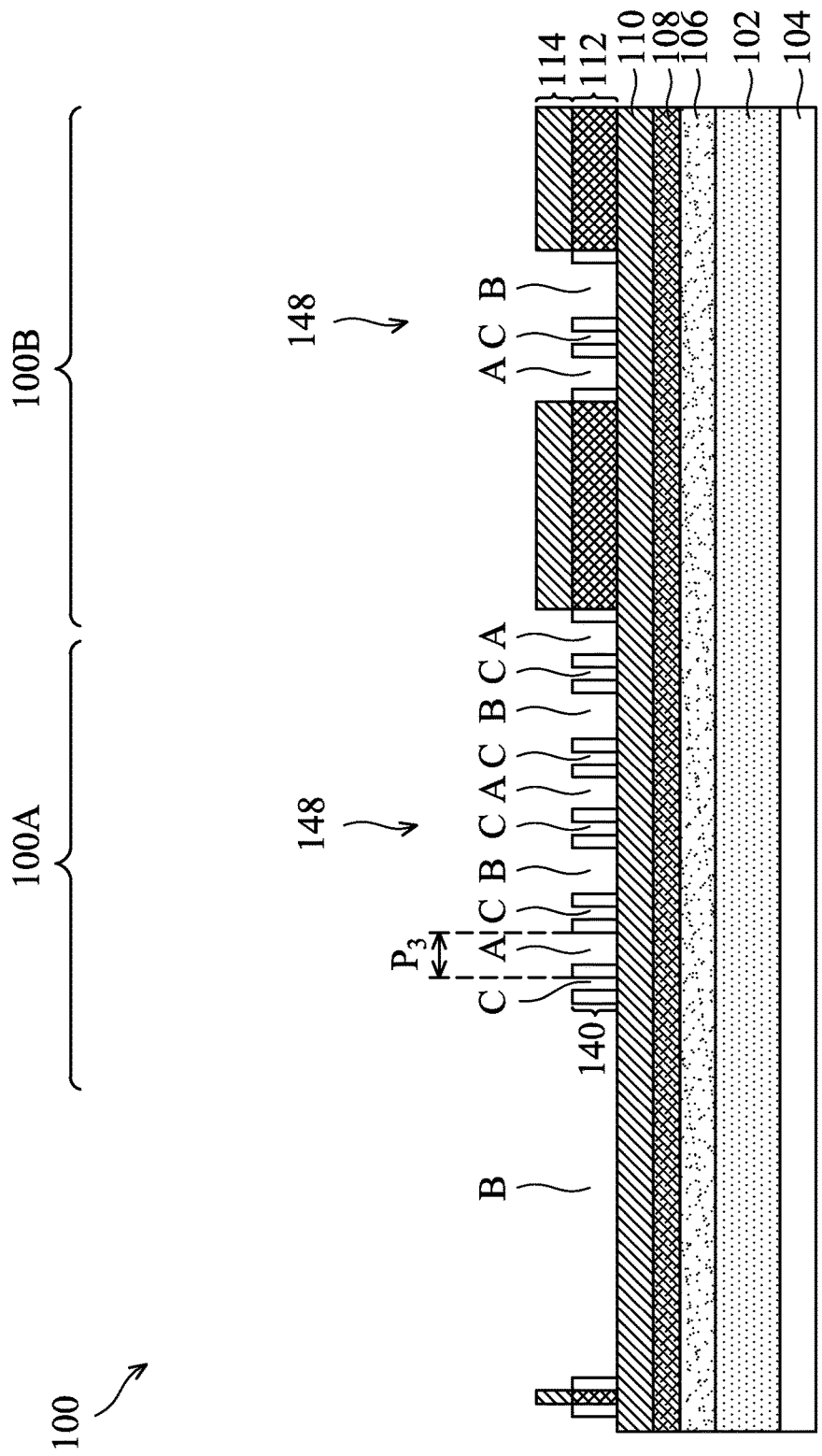

In FIGS. 14A and 14B, the fourth mandrel etching process is continued to remove portions of the first intermediate mandrels 112 and the second dielectric caps 114 exposed by the openings 148 extending through the bottom layer 142. During the fourth mandrel etching process, the upper layer 146, middle layer 144, and bottom layer 142 may be consumed. In some embodiments, an ashing process may be performed to remove remaining residue of the bottom layer 142. Throughout the description, the patterns of openings 148 may also be referred to as "line-C" patterns. The line-C patterns are formed between the line-A and the line-B patterns (labeled in FIG. 14B). In an embodiment, the pattern of the bottom layer 142 exposes all of the first intermediate mandrels 112 in the first region 100A, such that, after the second etching, each of the second spacers 140 remain in the first region 100A with no mandrels between them. Further, in some embodiments, the pattern of the bottom layer 142 may only partially expose some of the first intermediate mandrels 112. After etching, the pitch $P_3$ of the second spacers 140 in the first region 100A may be equal to about a quarter of the pitch $P_1$ (see, e.g., FIG. 1).

Figure 15A:
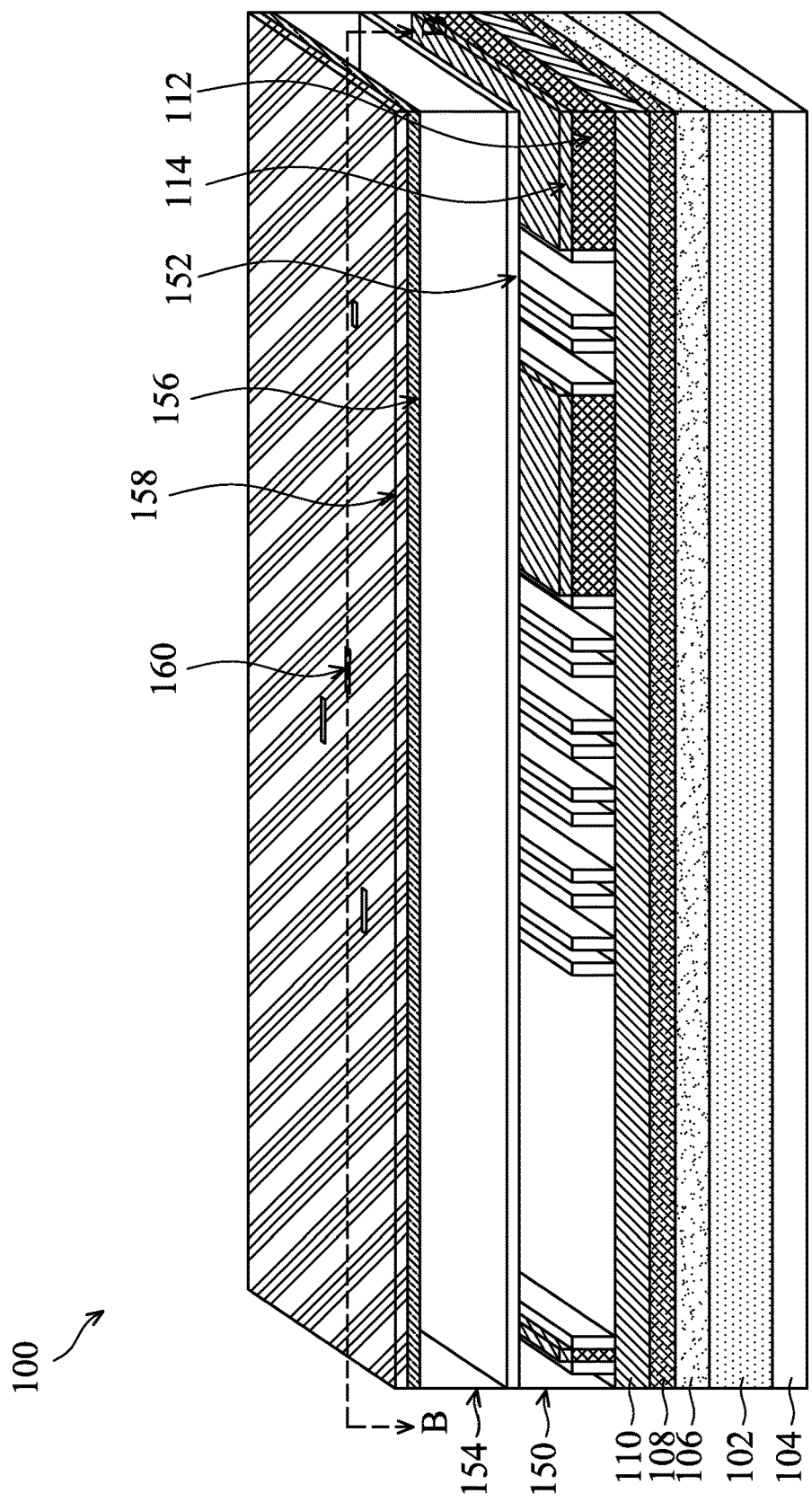
Figure 15B:
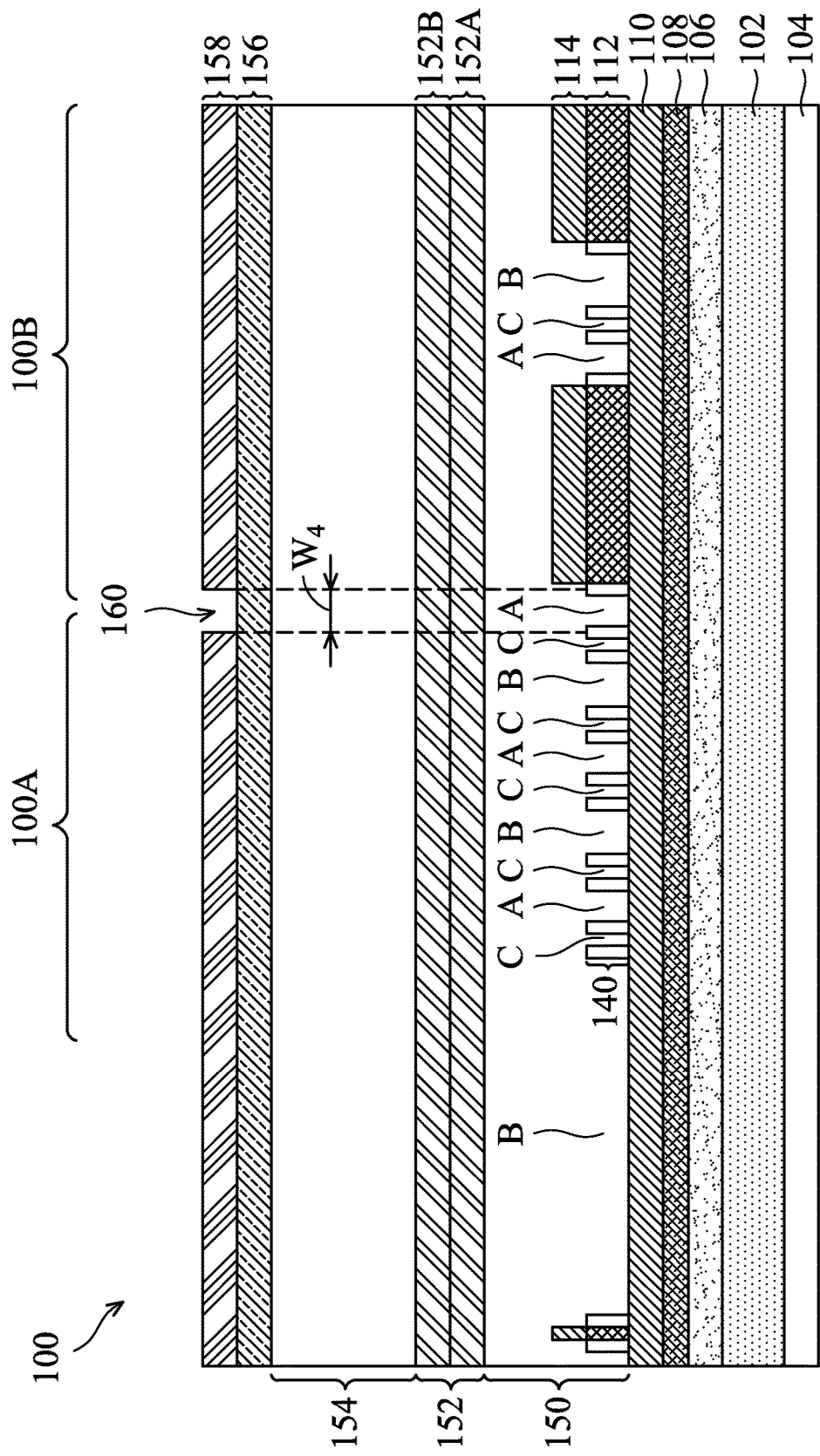

In FIGS. 15A and 15B, a photoresist structure is formed on the devices shown in FIGS. 14A and 14B. The photoresist structure includes a bottom layer 150 and middle layers 152. The bottom layer 150 may be formed of a material selected from the same candidate material of the bottom layer 118, and may be formed using a method that is selected from the same group of candidate methods for forming the bottom layer 118.

The middle layers 152 include a first layer 152A and a second layer 152B. The first layer 152A is an etch stop layer, and may be formed of a material selected from the same candidate material of the middle layer 120, and may be formed using a method that is selected from the same group of candidate methods for forming the middle layer 120.

The second layer 152B is a dielectric layer that has a high etch selectivity relative to the first layer 152A. The second layer 152B may, for example, be an oxide (such as silicon oxide), and may be formed with any suitable deposition process. In an embodiment, the second layer 152B is an oxide formed with a low-temperature CVD process. The low-temperature CVD process may be performed at a temperature of less than about 400° C. In an embodiment, the second layer 152B and the first layer 152A may have an etch selectivity greater than 3.0 relative a same etching process. The second layer 152B may be formed to have a thickness of between about 100 Å and about 300 Å.

Further in FIGS. 15A and 15B, a tri-layer photoresist that includes a bottom layer 154, a middle layer 156, and a upper layer 158 is formed on the photoresist structure. The bottom layer 154, middle layer 156, and upper layer 158 may be formed of a material selected from the same candidate material of the bottom layer 118, middle layer 120, and upper layer 122, respectively, and may be formed using a method that is selected from the same group of candidate methods for forming the bottom layer 118, middle layer 120, and upper layer 122, respectively.

The upper layer 158 is patterned using a suitable photolithography technique to form first mask openings 160 therein. The pattern of the first mask openings 160 correspond to cuts that will be made along the line-A, line-B, and line-C patterns in subsequent processing steps. The first mask openings 160 may be formed over different lines, e.g., above the first dielectric hard mask layer 110 and between respective pairs of the second spacers 140, and may be formed to have widths $W_4$ that are slightly larger than the distances between the second spacers 140. Each of the openings 160 have about the same size (width $W_4$). For example, the widths $W_4$ of the first mask openings 160 are wider than the distances between inner sidewalls of adjacent second spacers 140, but are not wider than the distance between outer sidewalls of adjacent second spacers 140. Advantageously, the first mask openings 160 do not cross over lines, which may reduce the defects caused by inadvertently masking multiple lines and merging line patterns. The first mask openings 160 may be formed at different positions along longitudinal axes of the different lines.

Figure 16A:
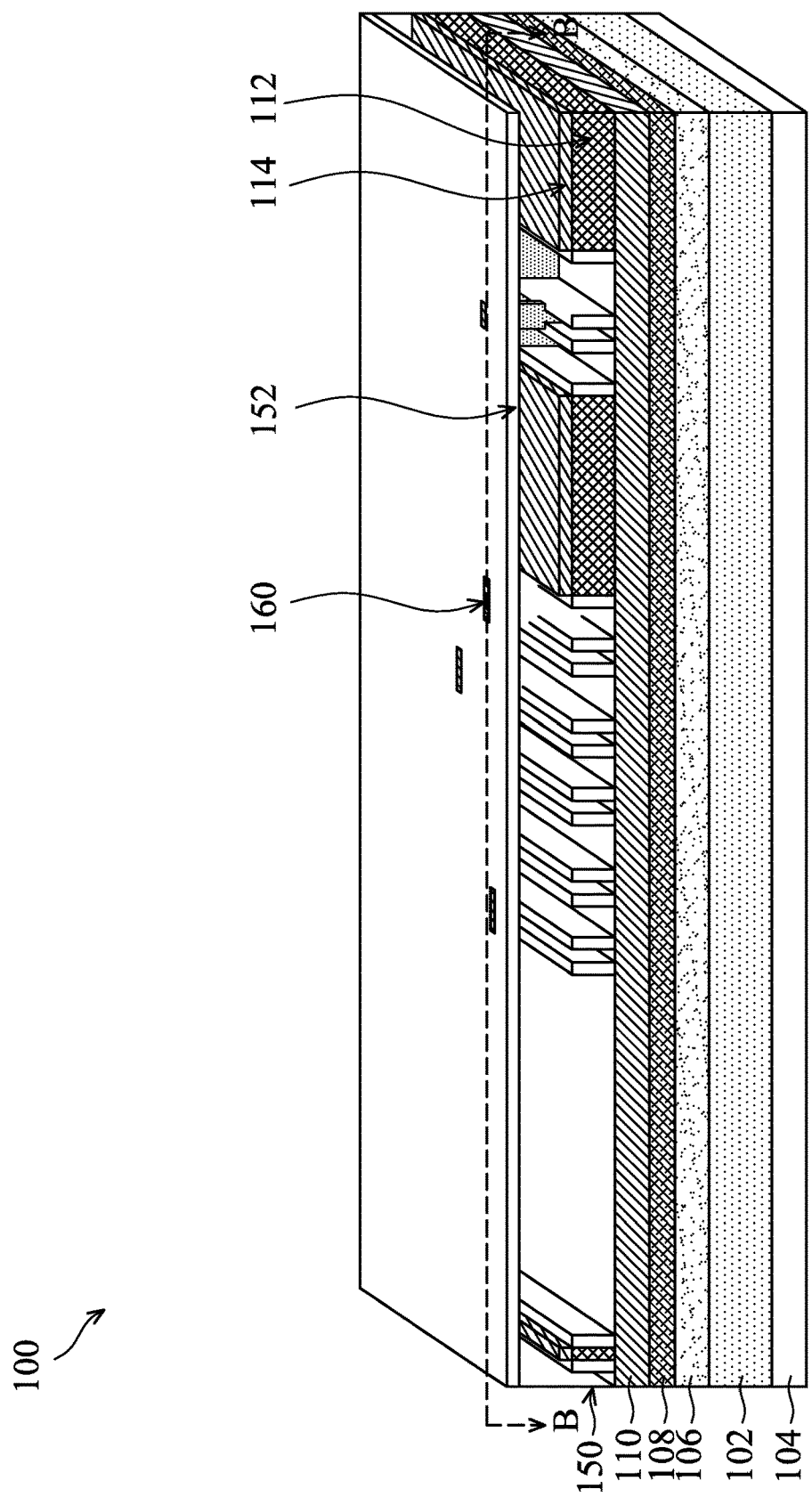
Figure 16B:
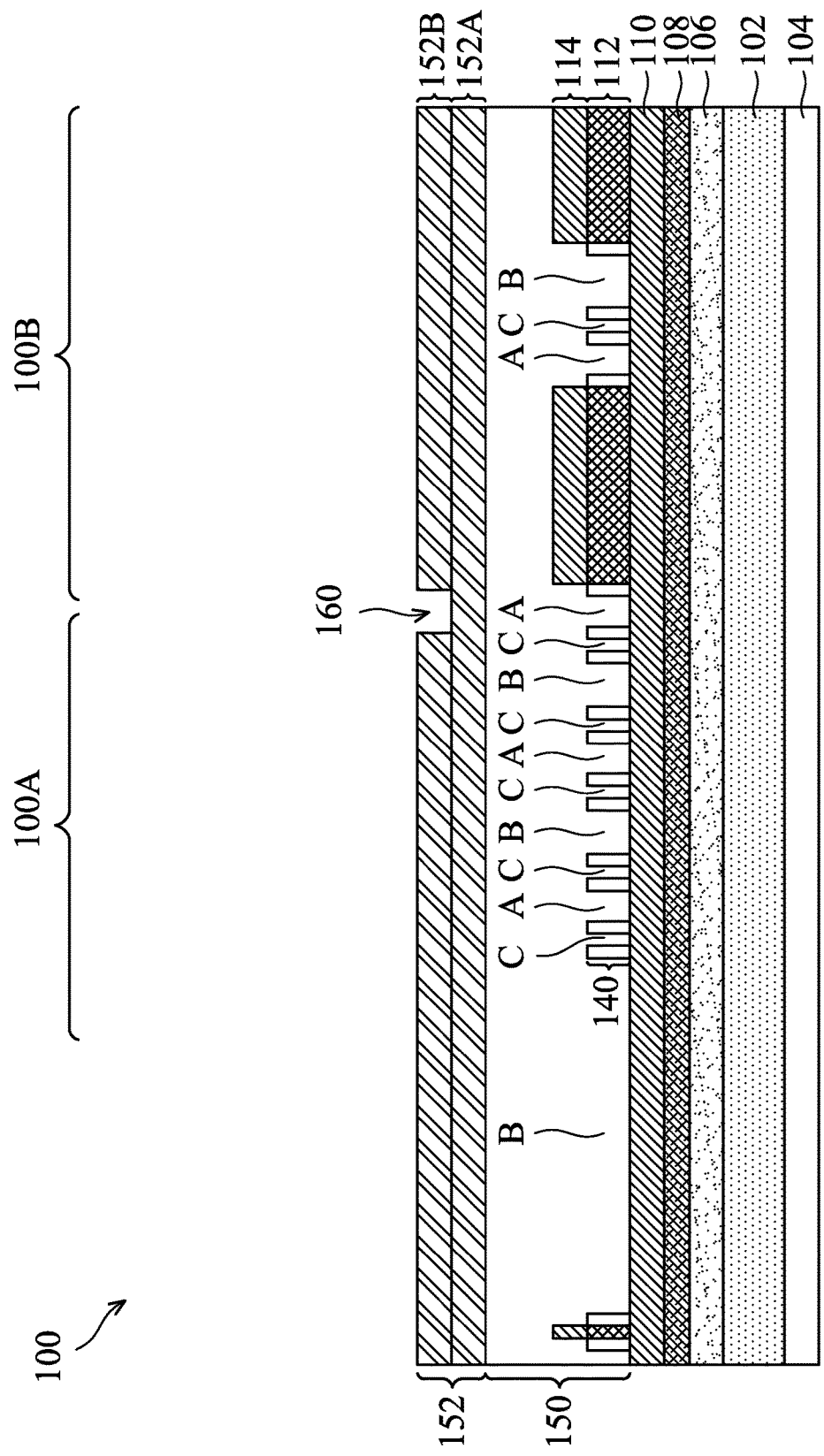

In FIGS. 16A and 16B, a first hard mask etching process is performed to transfer the pattern of the upper layer 158 to the middle layer 156, the bottom layer 154, and then the second layer 152B. The first mask openings 160 are thereby transferred to the second layer 152B. As noted above, the first layer 152A and second layer 152B have a high etch selectivity. As such, the first layer 152A acts as an etch stop layer, and the pattern of the first mask openings 160 are not transferred to the first layer 152A. The first hard mask etching process may be an anisotropic etch. During the first hard mask etching process, the bottom layer 154, middle layer 156, and upper layer 158 may be consumed. In some embodiments, an ashing process may be performed to remove remaining residue of the bottom layer 154.

Figure 17A:
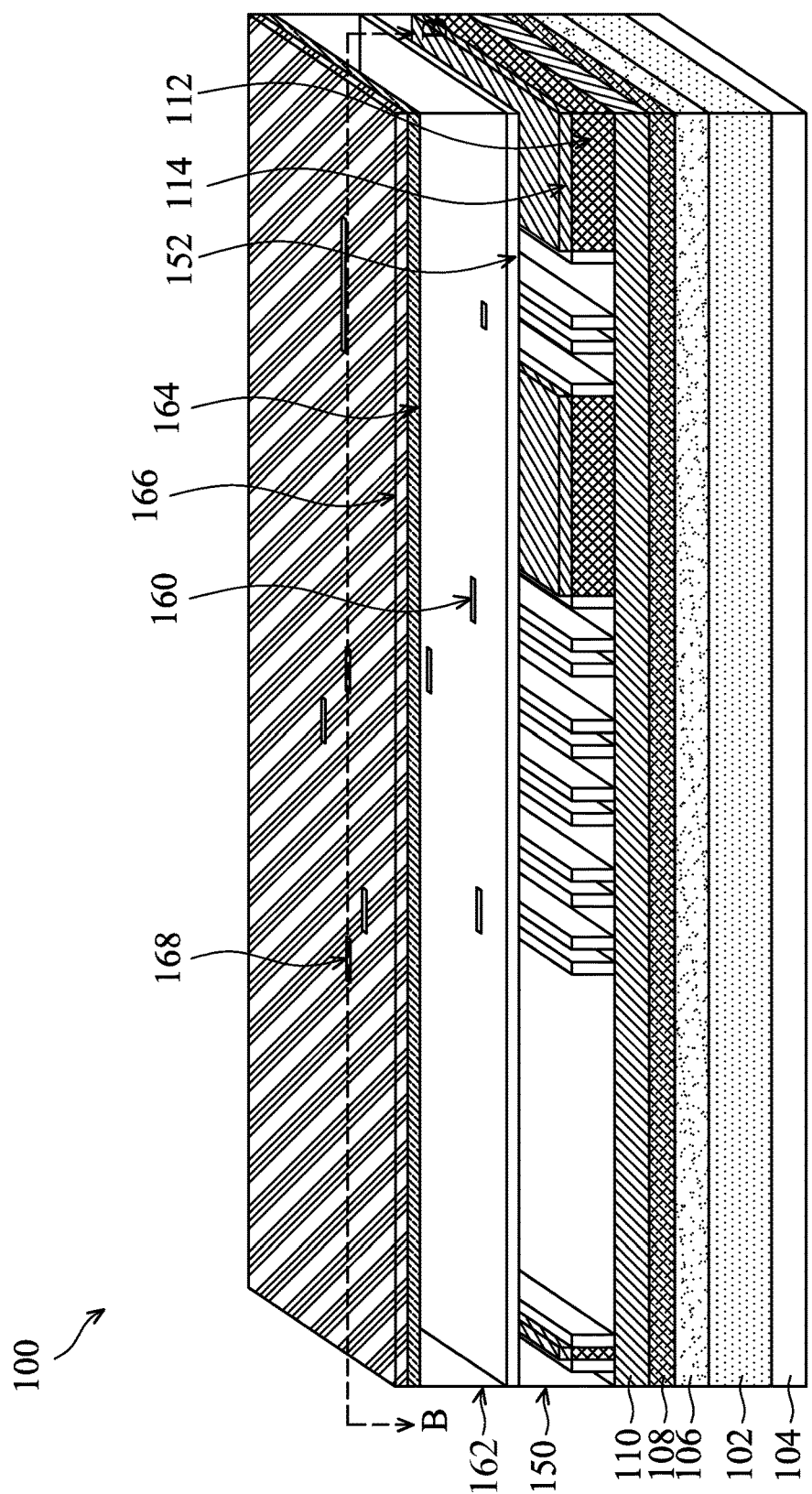
Figure 17B:
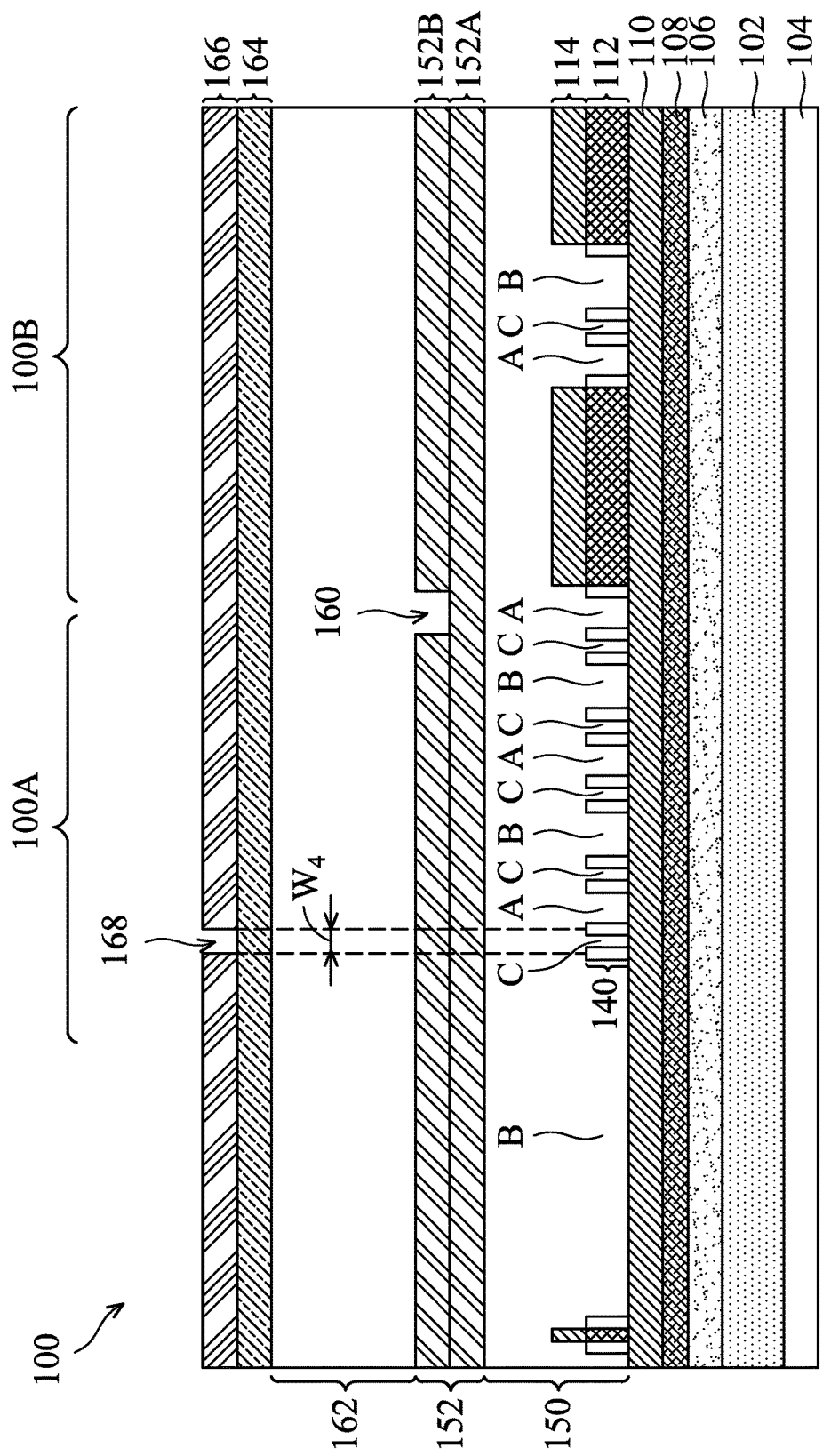

In FIGS. 17A and 17B, a tri-layer photoresist that includes a bottom layer 162, a middle layer 164, and a upper layer 166 is formed on the photoresist structure. The bottom layer 162, middle layer 164, and upper layer 166 may be formed of a material selected from the same candidate material of the bottom layer 118, middle layer 120, and upper layer 122, respectively, and may be formed using a method that is selected from the same group of candidate methods for forming the bottom layer 118, middle layer 120, and upper layer 122, respectively.

The upper layer 166 is patterned using a suitable photolithography technique to form second mask openings 168 therein. The second mask openings 168 have a similar width $W_4$ as the width $W_4$ of the first mask openings 160. The pattern of the second mask openings 168 correspond to further cuts that will be made along the line-A, line-B, and line-C patterns in subsequent processing steps. The second mask openings 168 may be formed over different lines, e.g., above the first dielectric hard mask layer 110 and between respective pairs of the second spacers 140, and may be formed to have widths greater than the distances between the second spacers 140. The second mask openings 168 also do not cross over lines. The second mask openings 168 may be formed at different positions along longitudinal axes of the different lines.

Figure 18A:
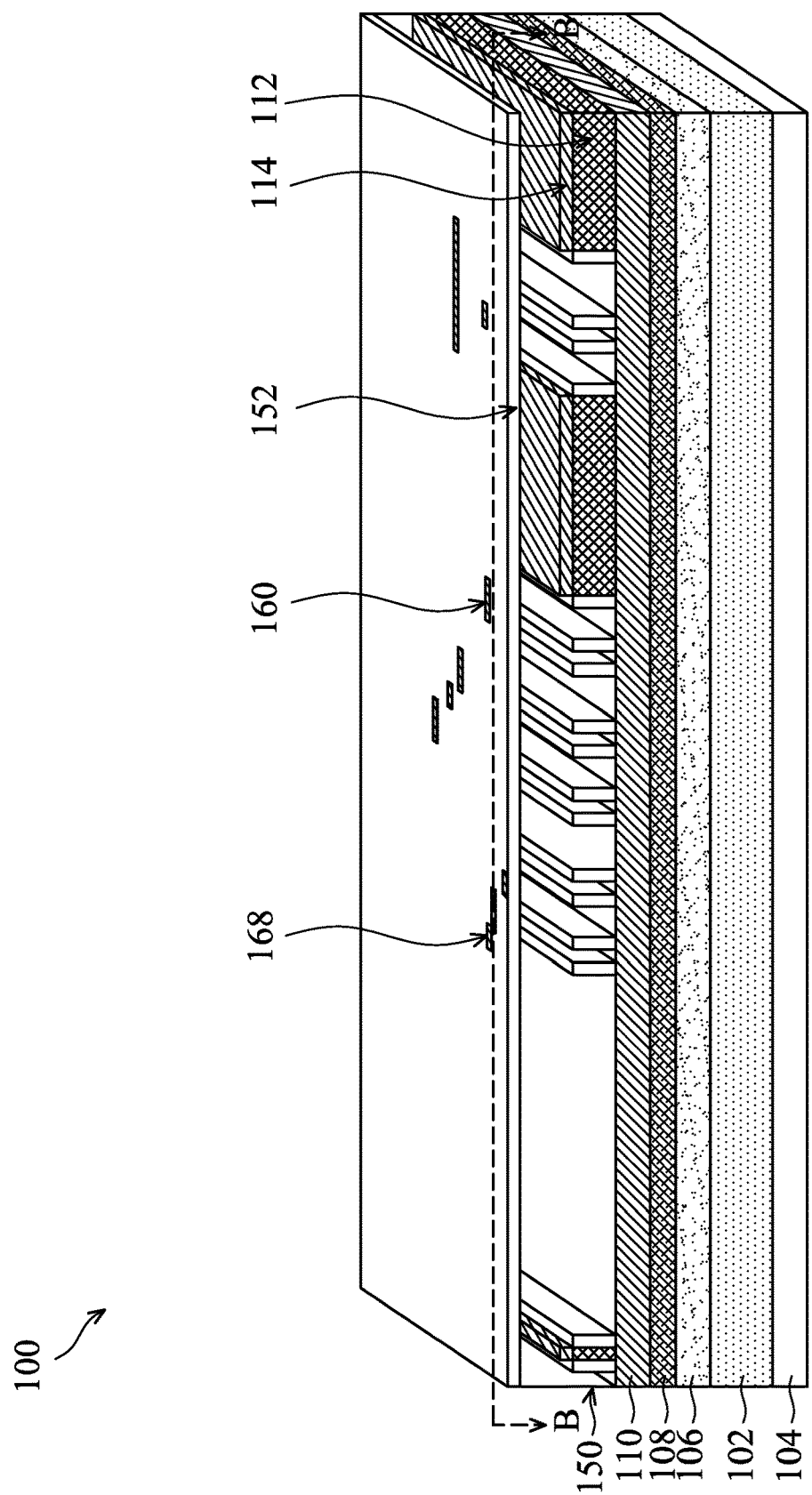
Figure 18B:
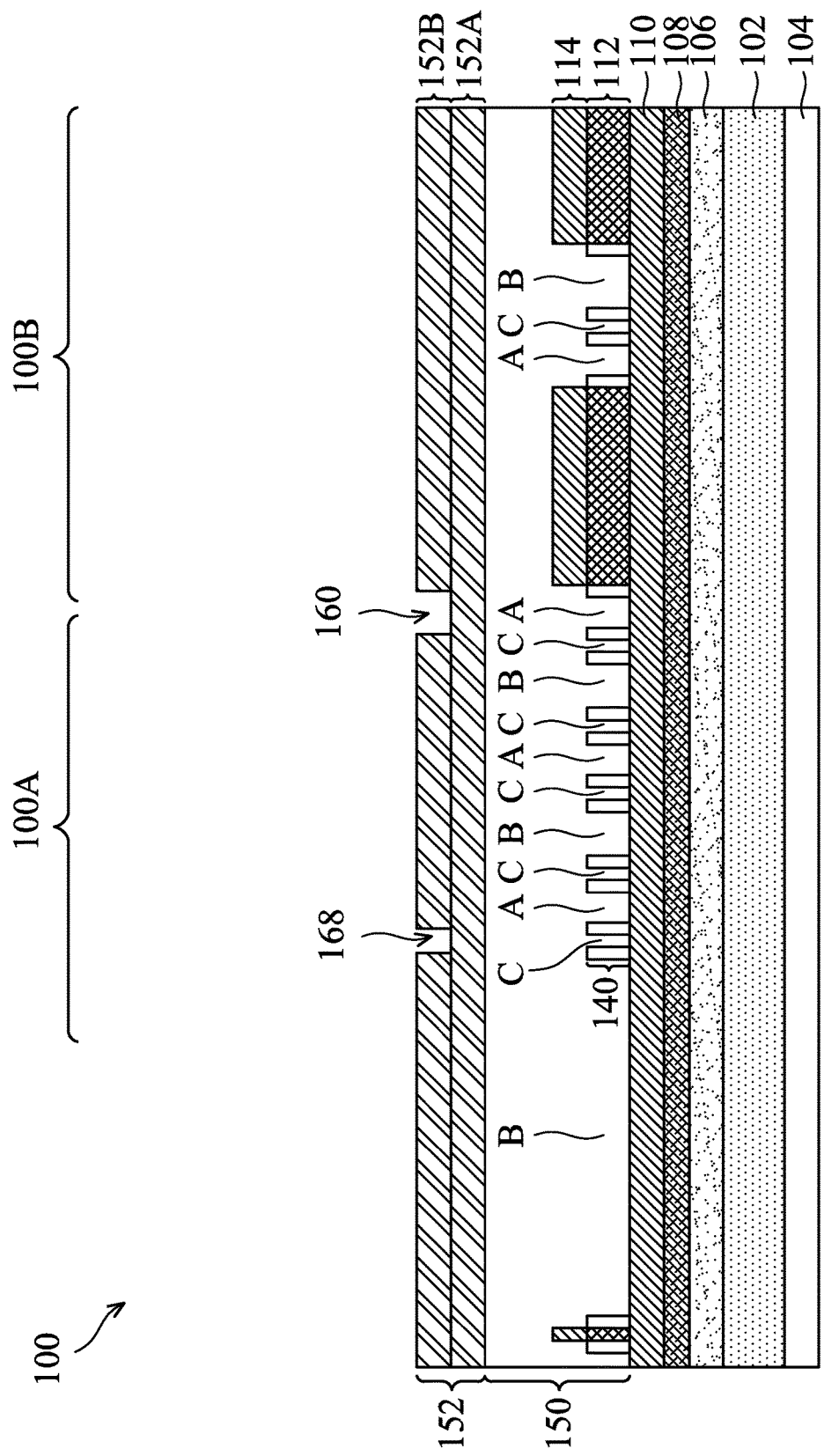

In FIGS. 18A and 18B, a second hard mask etching process is performed to transfer the pattern of the upper layer 166 to the middle layer 164, the bottom layer 162, and then the second layer 152B. The second mask openings 168 are thereby transferred to the second layer 152B. As noted above, the first layer 152A and second layer 152B have a high etch selectivity. As such, the first layer 152A acts as an etch stop layer, and the pattern of the second mask openings 168 are not transferred to the first layer 152A. The second hard mask etching process may be an anisotropic etch.

During the second hard mask etching process, the bottom layer 162, middle layer 164, and upper layer 166 may be consumed. In some embodiments, an ashing process may be performed to remove remaining residue of the bottom layer 162.

After the second hard mask etching process, the second layer 152B includes the first mask openings 160 and second mask openings 168. The process steps discussed above with respect to FIGS. 15A through 18B may be repeated as many times as desired to form cut patterns for line-A, line-B, and line-C on the second layer 152B. All openings corresponding to cuts in the lines may be formed on the second layer 152B.

Figure 19A:
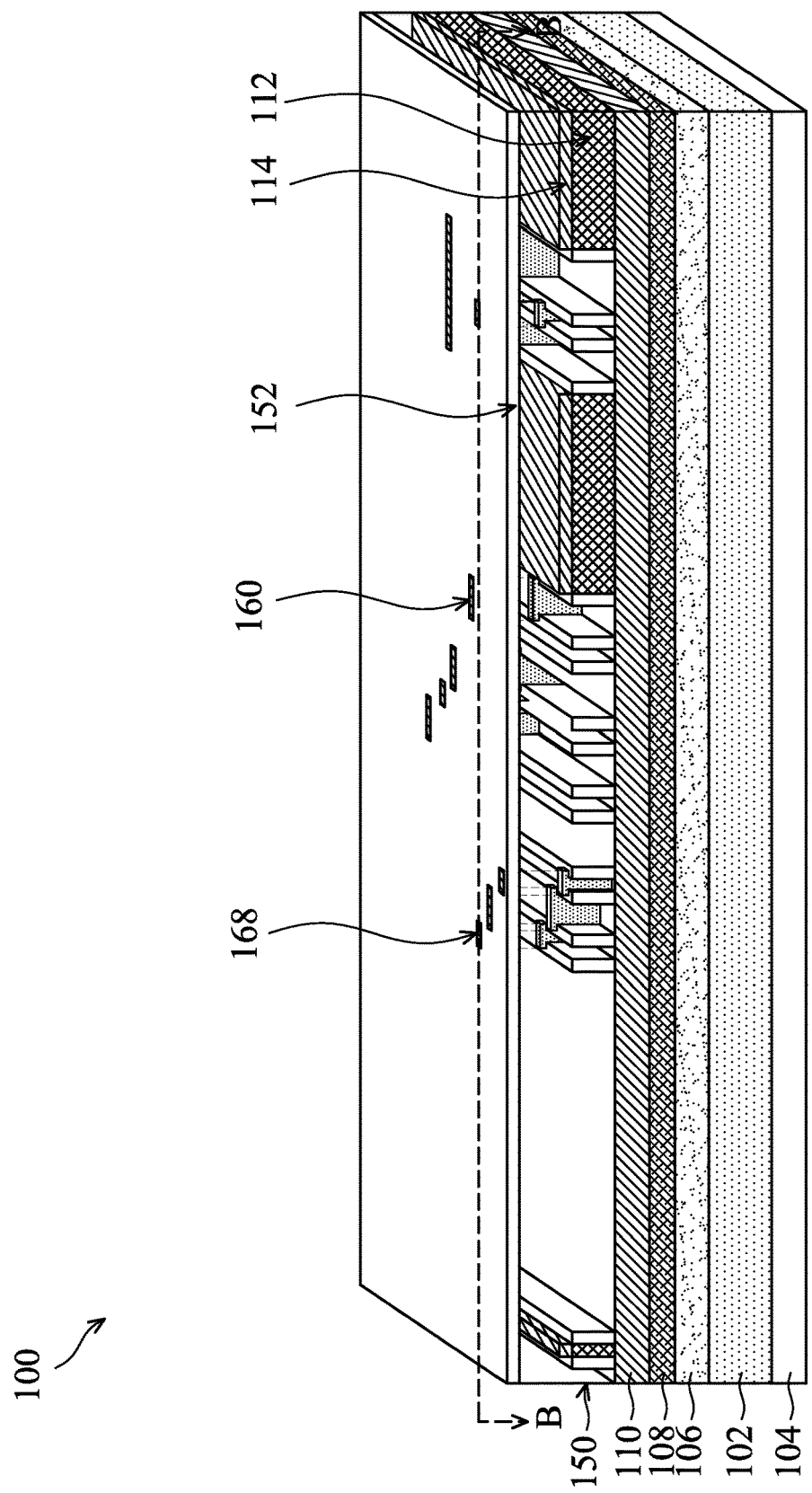
Figure 19B:
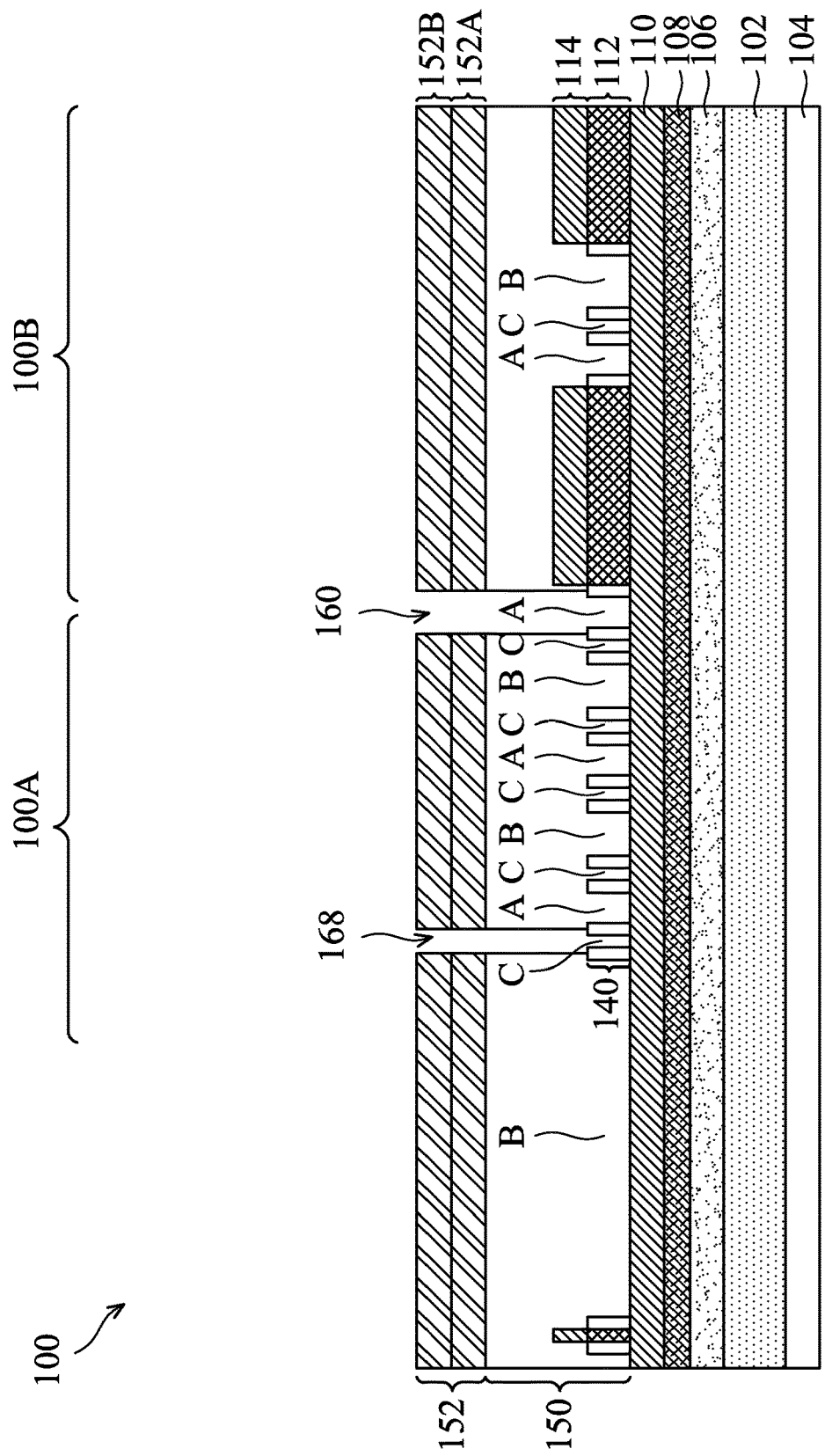

In FIGS. 19A and 19B, an etching process is performed to extend the first mask openings 160, second mask openings 168, and any other subsequently formed mask openings through the bottom layer 150. Each of the openings on the second layer 152B correspond to an opening between the second spacers 140. The first dielectric hard mask layer 110 between the second spacers 140 may be exposed by the openings.

Figure 20A:
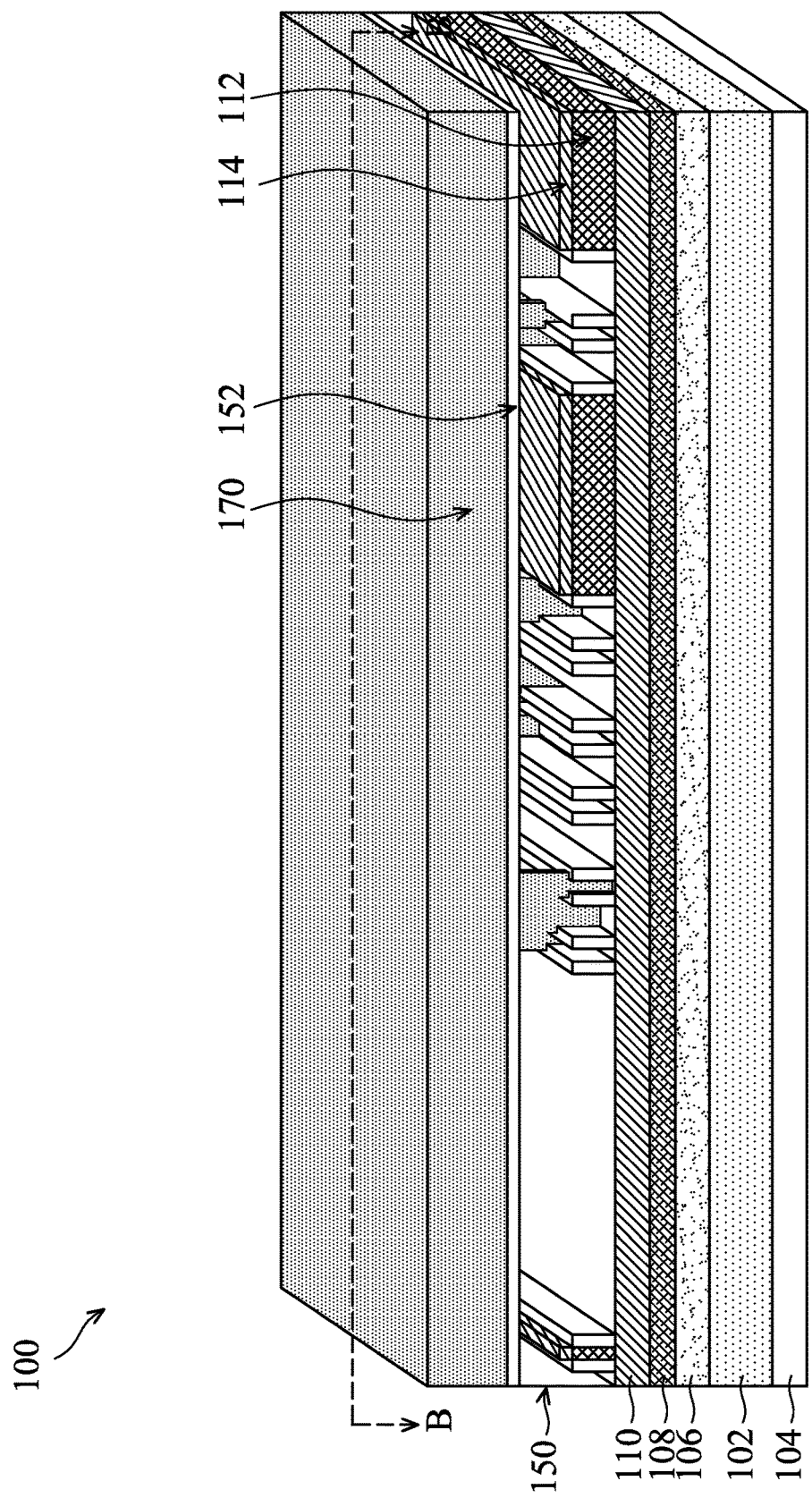
Figure 20B:
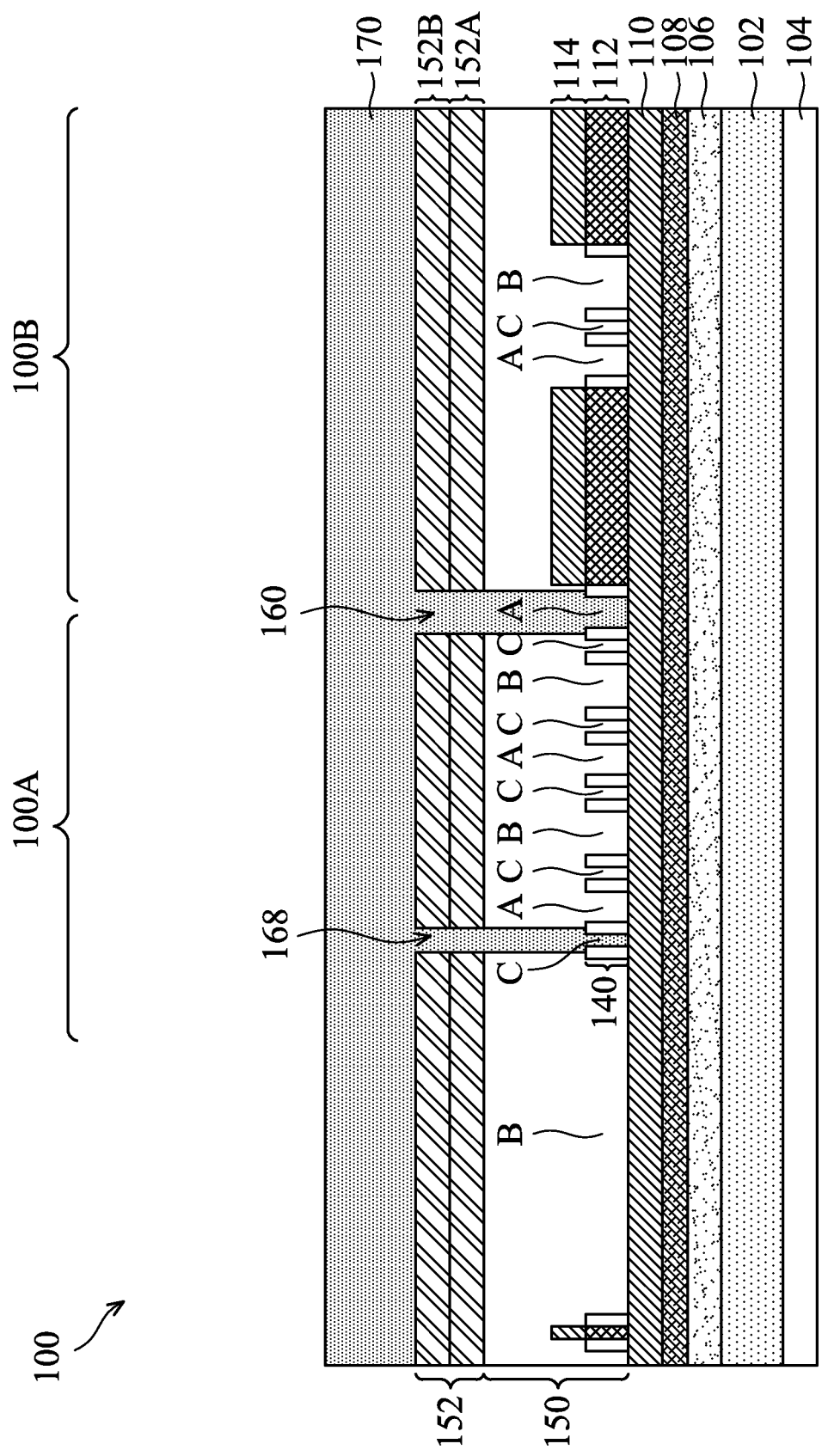

In FIGS. 20A and 20B, a reverse material 170 is conformally formed over the wafer 100. The reverse material 170 fills the first mask openings 160, the second mask openings 168, and any other subsequently formed mask openings, and also extends along the top surface of the second layer 152B. As such, after formation, the reverse material 170 is disposed between the second spacers 140 and contacts a layer immediately underlying second spacers 140 (e.g., the first dielectric hard mask layer 110). In various embodiments, the reverse material 170 may be spun on glass (SOG) or any other suitable material.

Figure 21A:
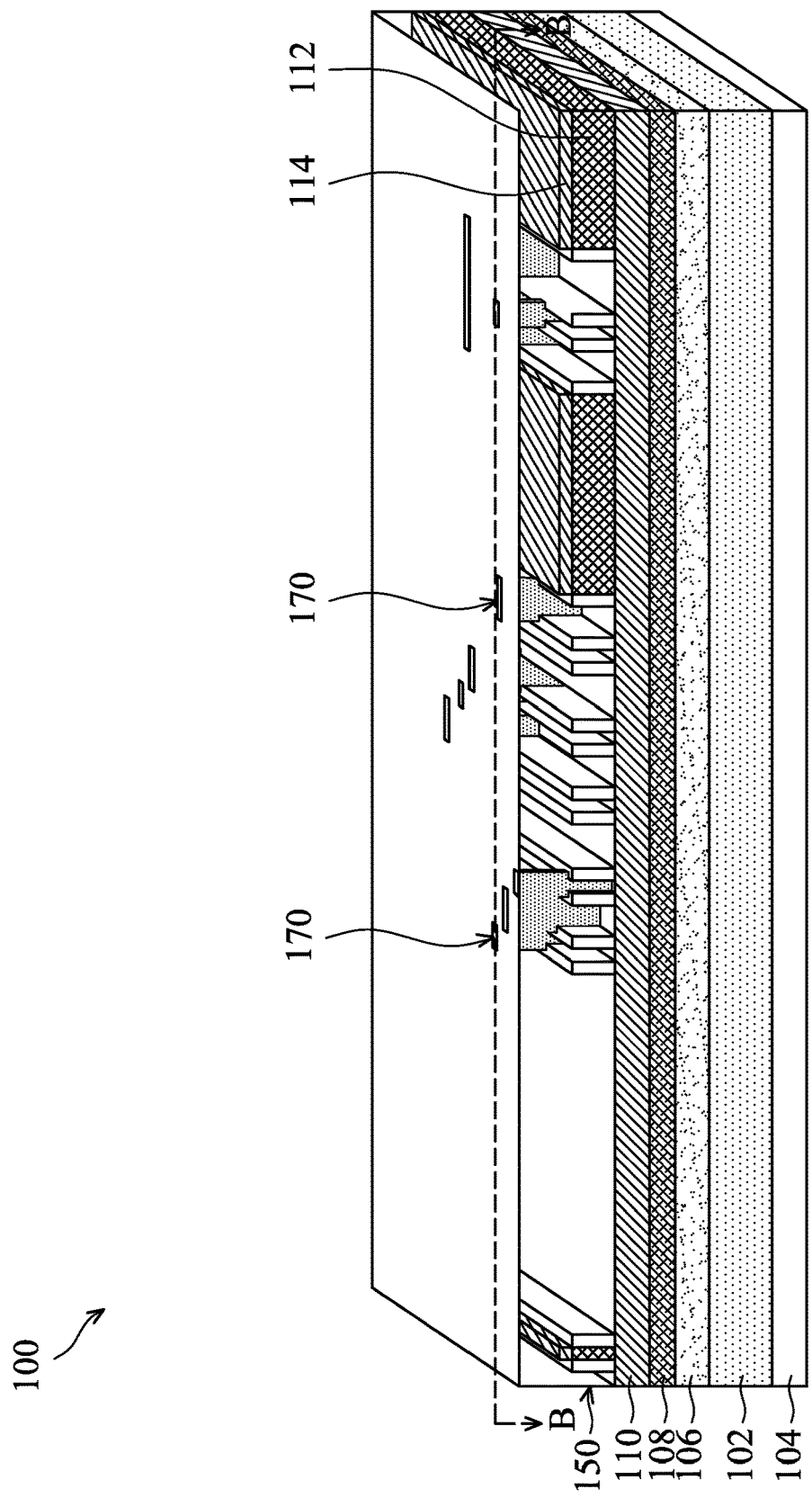
Figure 21B:
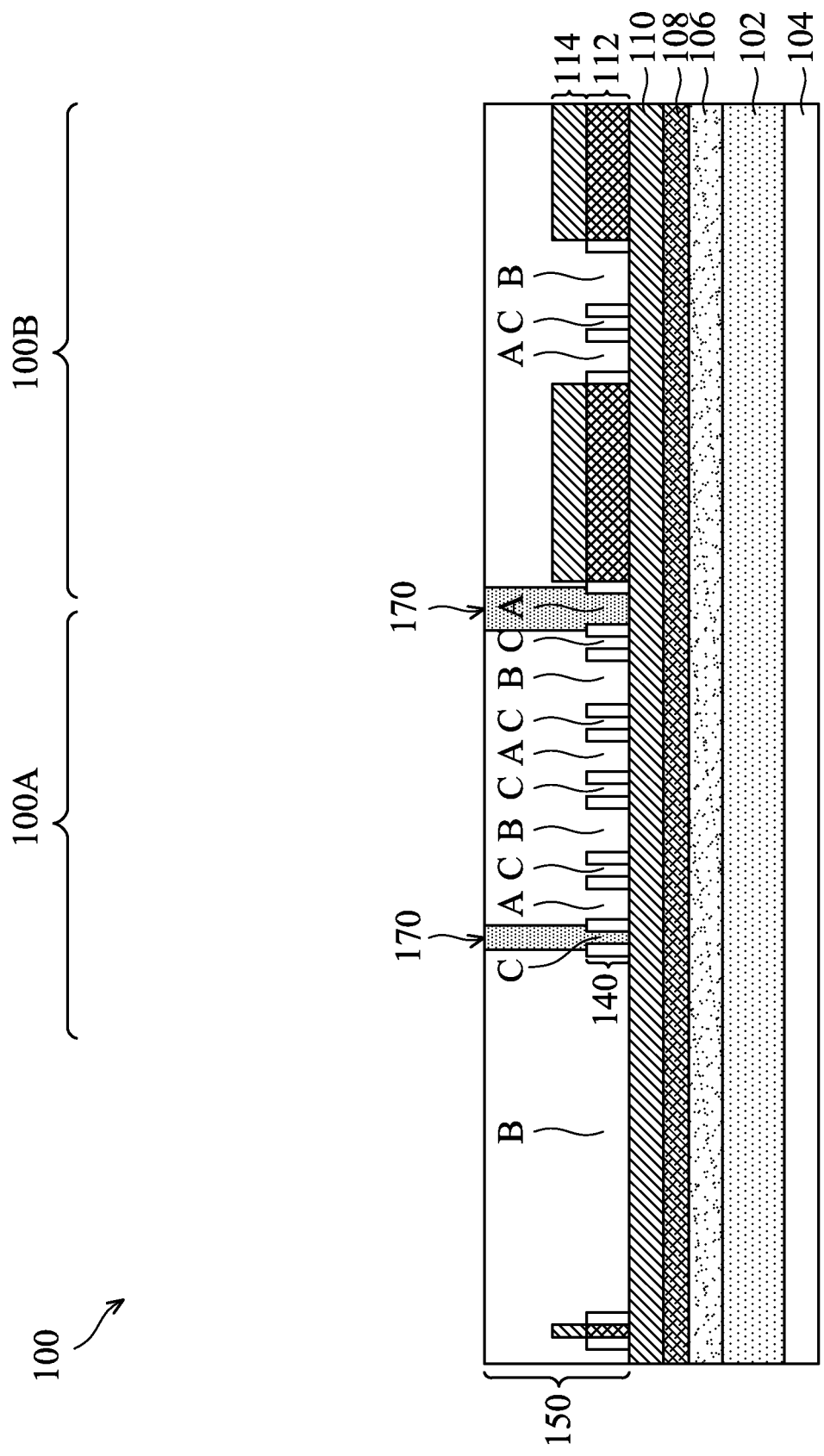

In FIGS. 21A and 21B, the middle layers 152 and top portions of the reverse material 170 may be removed. The removal process may be a planarization, such as a chemical-mechanical polish (CMP), a grinding process, or the like. Alternatively, the removal process may be an etch such as a dry etch, an isotropic etch, or the like.

Figure 22A:
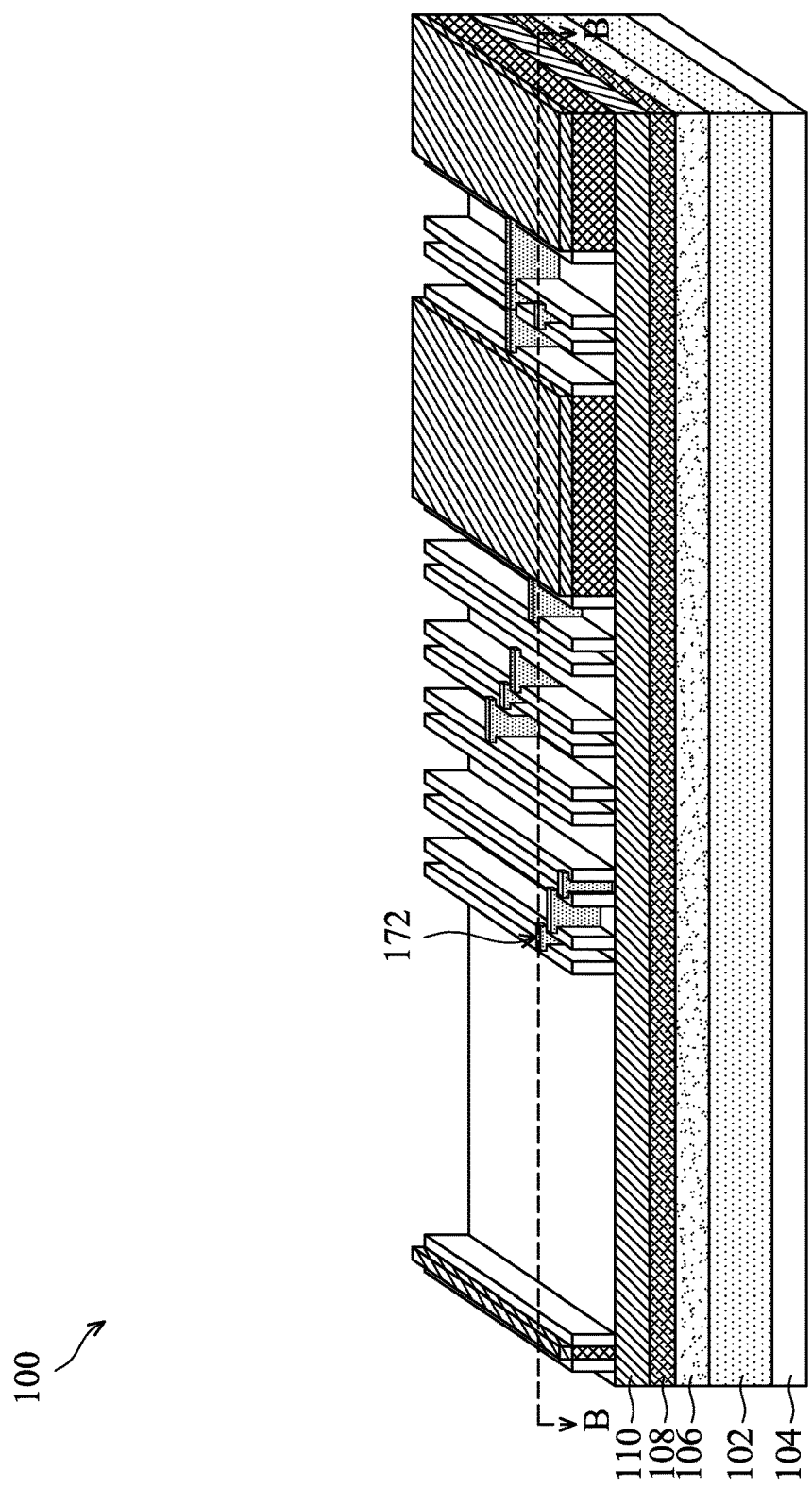
Figure 22B:
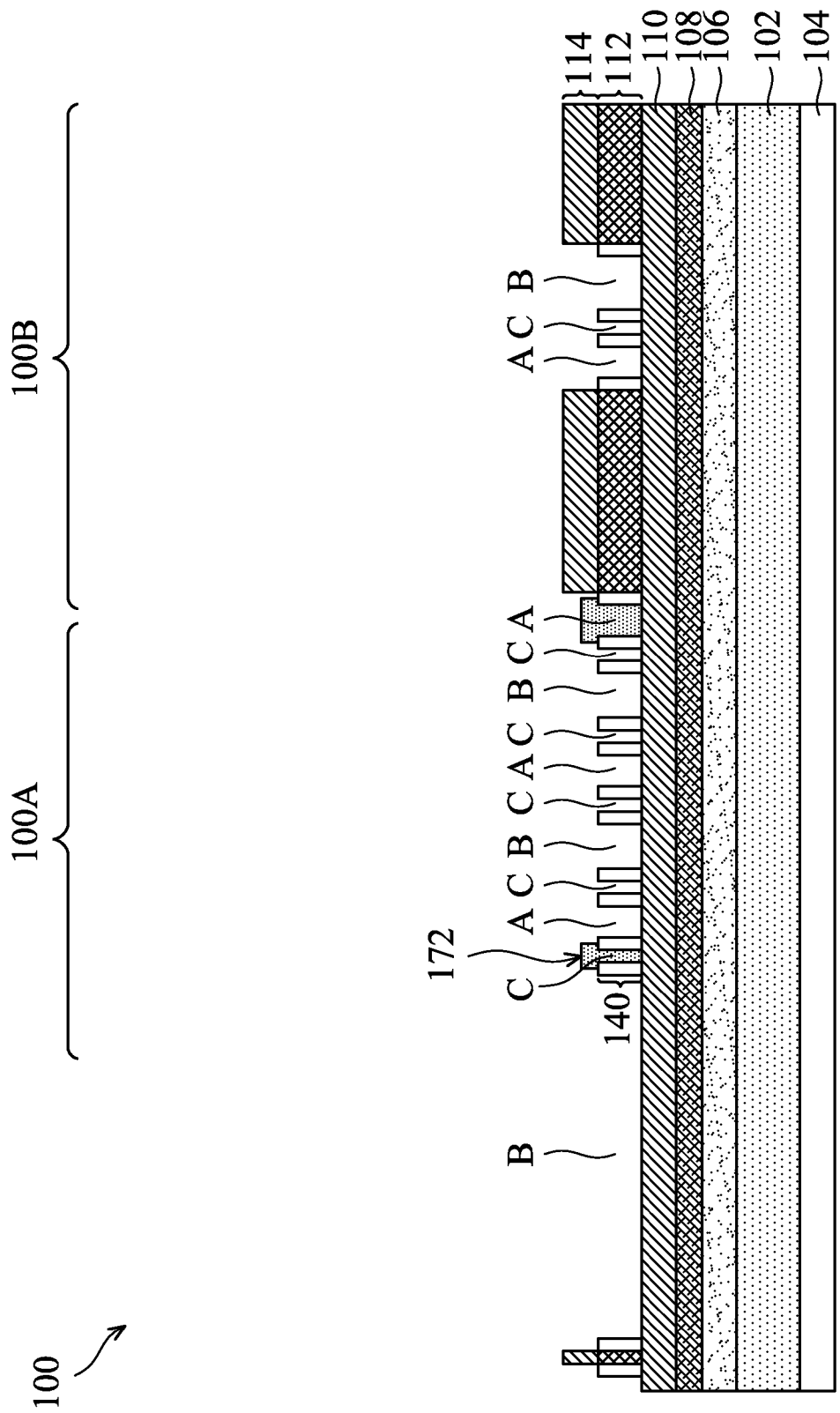

In FIGS. 22A and 22B the reverse material 170 may be recessed using, e.g., an etch-back process. Further, the bottom layer 150 is removed using a suitable process such as an ashing process. After the removal and the recess, remaining portions of the reverse material 170 are disposed between the second spacers 140. The remaining portions of the reverse material 170 between the second spacers 140 may be referred to as cut masks 172. Notably, the cut masks 172 do not span multiple lines.

FIGS. 23A through 26B illustrate top views and cross-sectional views of further intermediate stages in the formation of the features in the target layer, in accordance with some exemplary embodiments. In FIGS. 22A through 26B, figures ending with an "A" designation are plan views of the wafer 100, and figures ending with a "B" designation are cross-sectional views shown along a B-B line in the corresponding plan view.

Figure 23A:
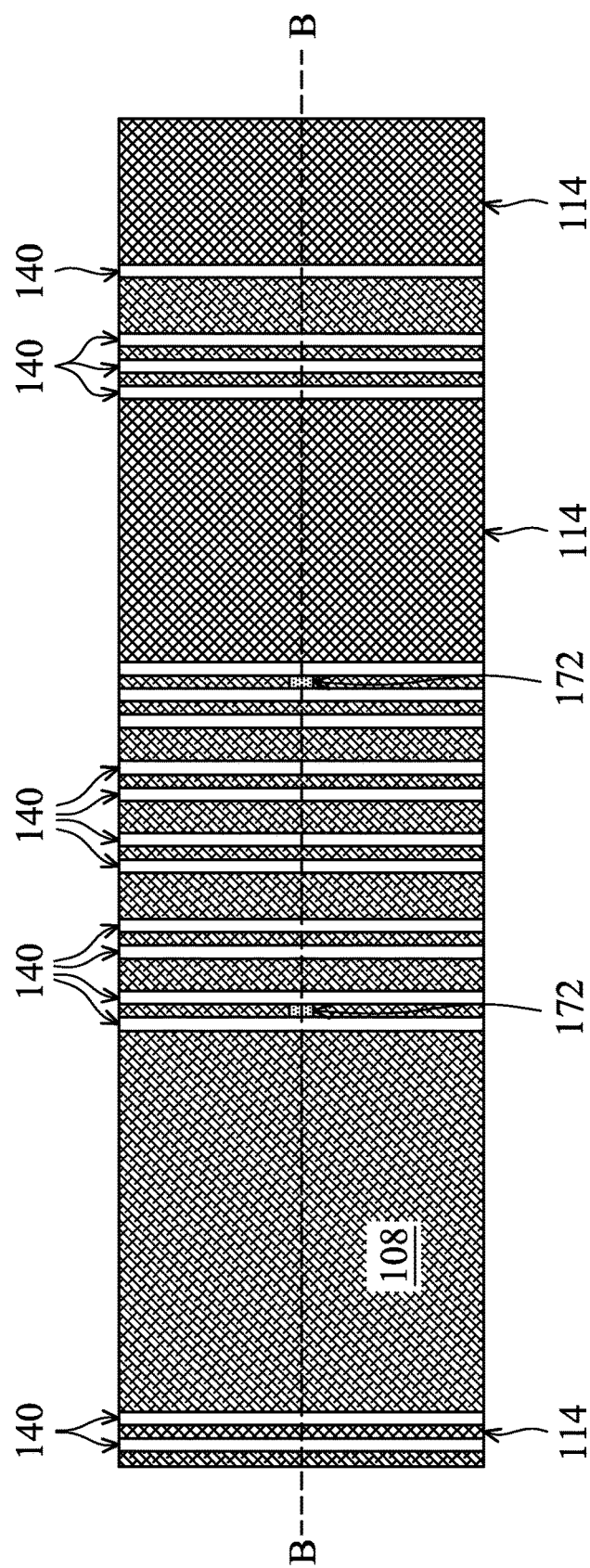
FIGS. 23A through 26B illustrate top views and cross-sectional views of further intermediate stages in the formation of the features in the target layer, in accordance with some embodiments.
Figure 23B:
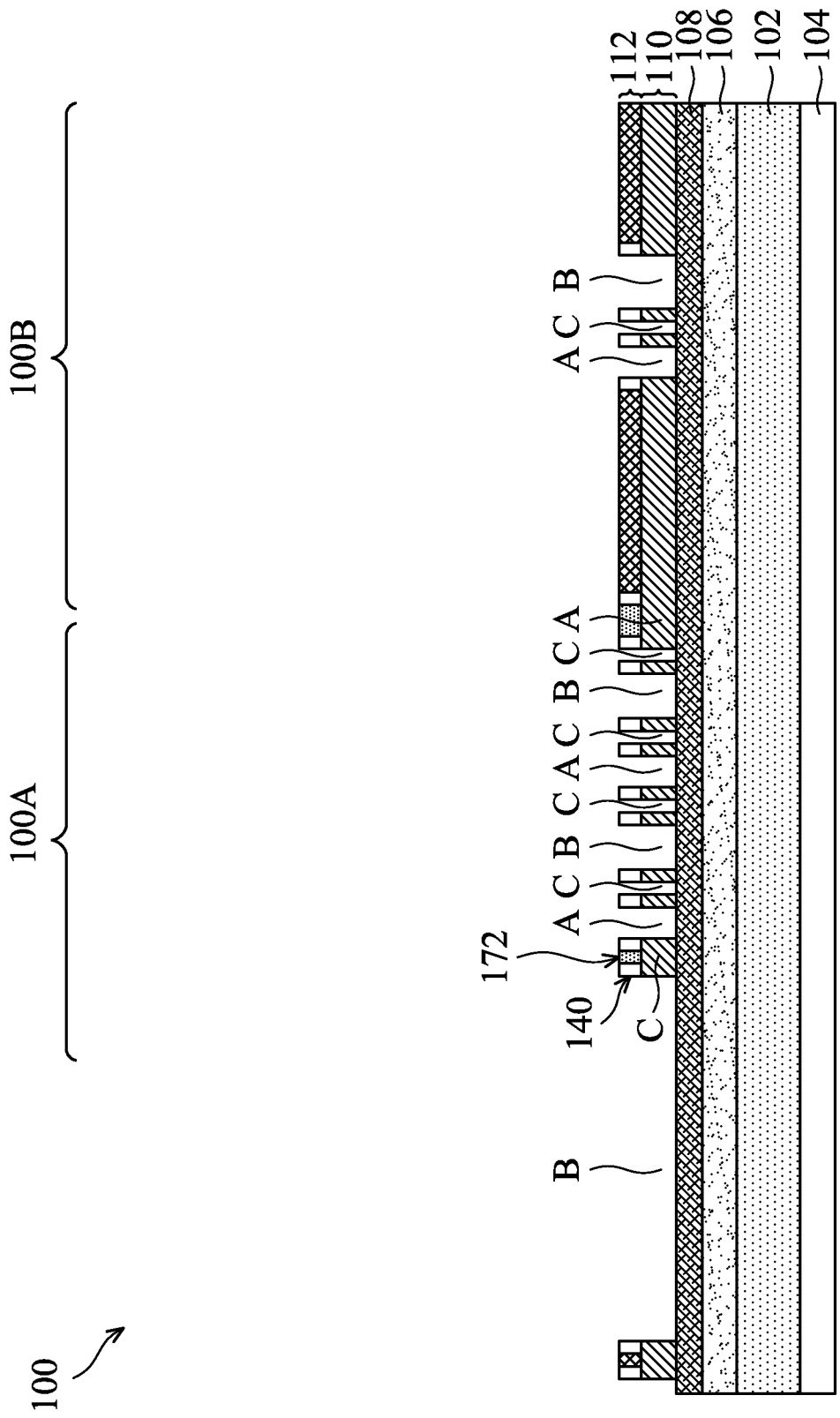

In FIGS. 23A and 23B, the second spacers 140, remaining first intermediate mandrels 112, remaining second dielectric caps 114, and cut masks 172 are in combination used as an etching mask to etch the first dielectric hard mask layer 110, to form openings in the first dielectric hard mask layer 110. Suitable photolithography and etching techniques may be used. In the etching process, the second spacers 140, first intermediate mandrels 112, and cut masks 172 may or may not be fully consumed. When the first intermediate mandrels 112 and cut masks 172 are not consumed, a cleaning process may be performed to remove residual material.

Figure 24A:
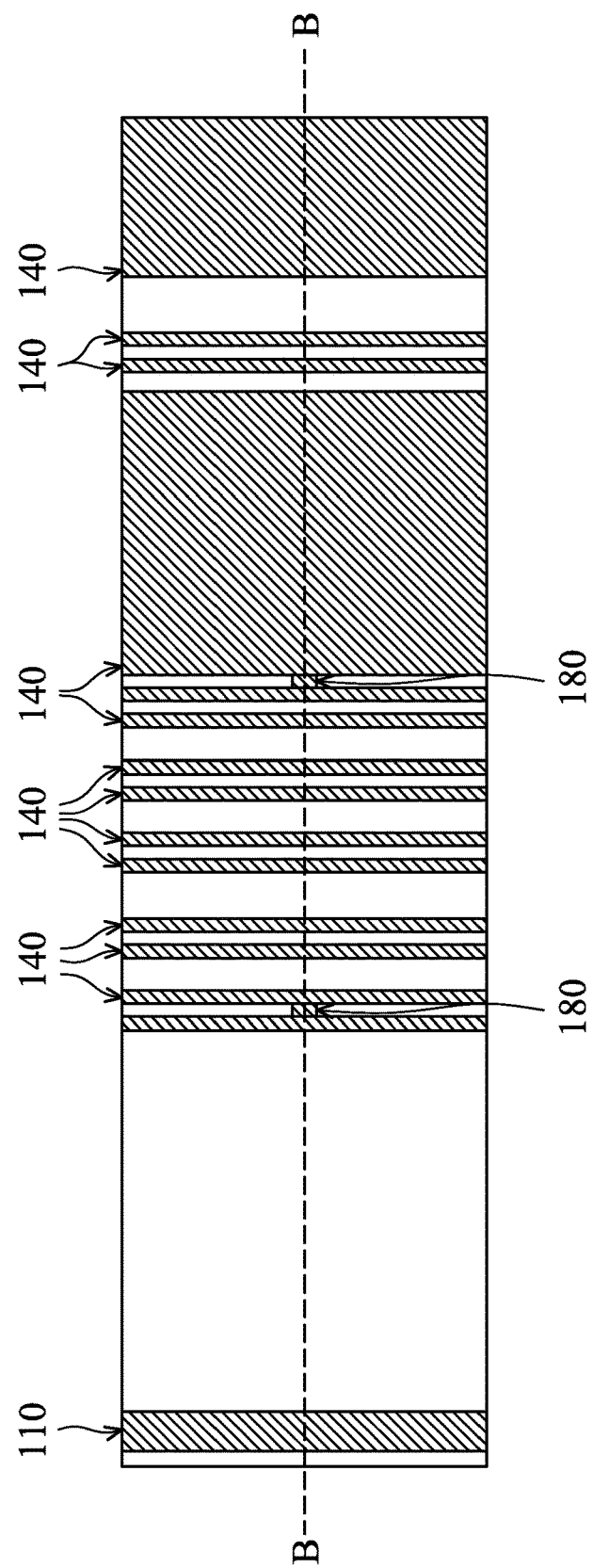
Figure 24B:
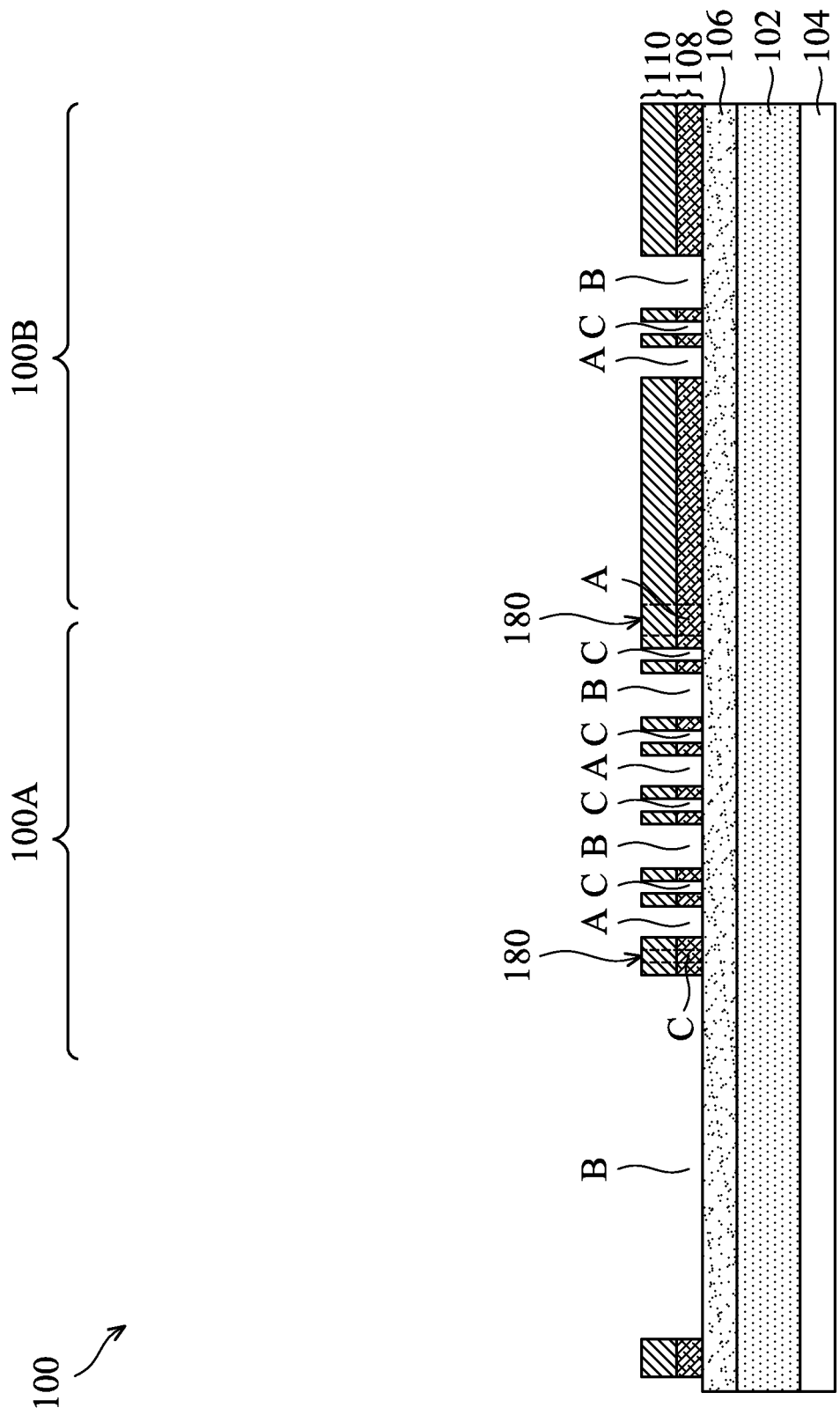

In FIGS. 24A and 24B, the patterned first dielectric hard mask layer 110 is used as an etching mask to etch the hard mask layer 108. As such, a pattern corresponding to both the desired lines (e.g., A, B, and C) and cuts 180 for the lines are simultaneously formed on the hard mask layer 108. The lines correspond to the second spacers 140. The cuts 180 for the lines correspond to the placement of the cut masks 172. By forming all desired lines (e.g., A, B, and C) first, and then patterning the cuts 180 for the lines on the second layer 152B after formation of all lines, the formation of the lines and the cuts 180 for the lines may be performed in a single etching step. The second spacers 140, first intermediate mandrels 112, and cut masks 172 may be consumed in this etching process. When the first intermediate mandrels 112 and cut masks 172 are not consumed, a cleaning process may be performed to remove residual material.

Figure 25A:
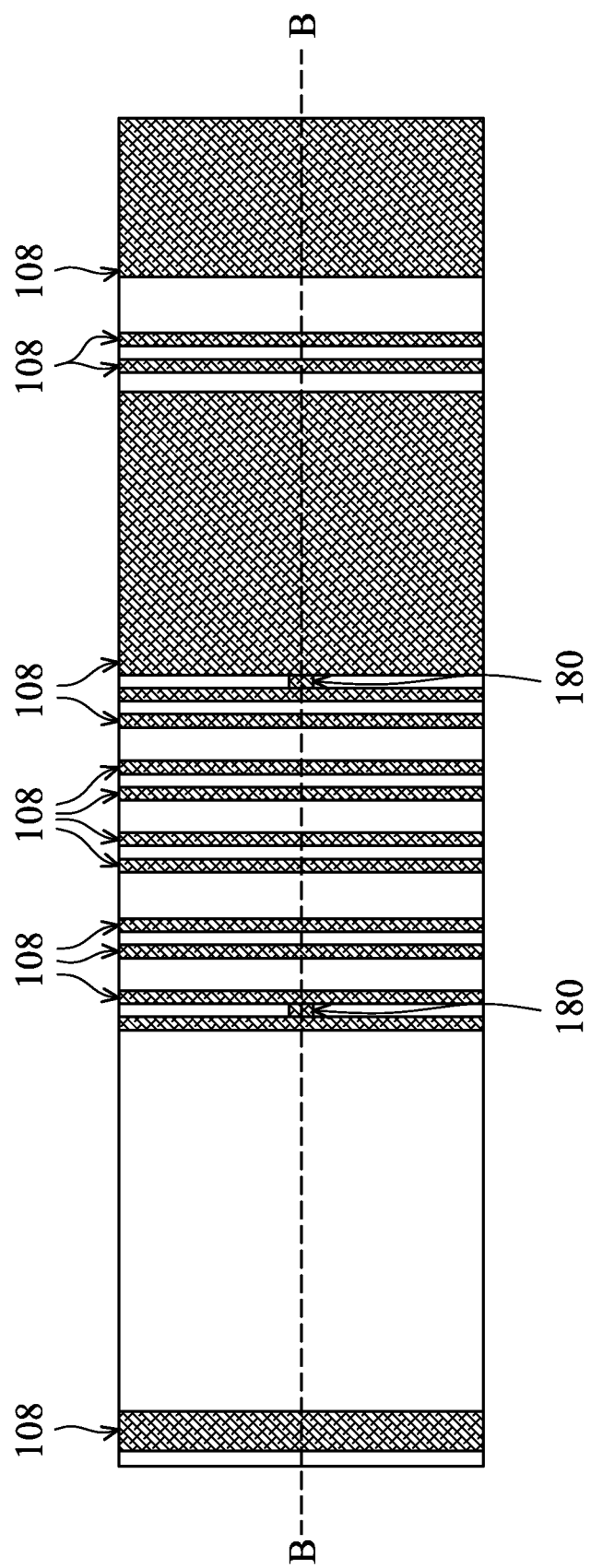
Figure 25B:
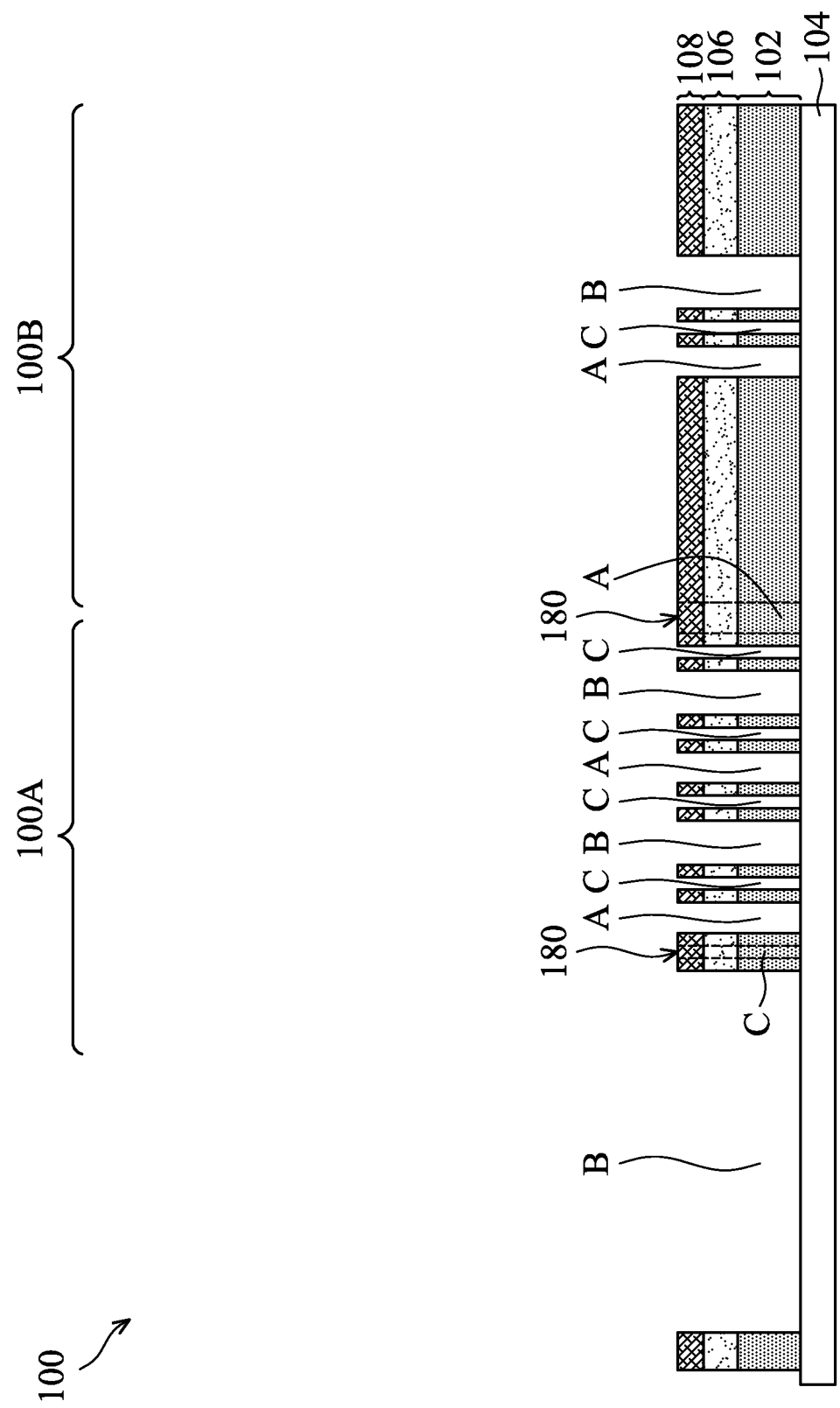

In FIGS. 25A and 25B, the patterned hard mask layer 108 is used as an etching mask to etch the underlying ARC 106 and subsequently the target layer 102. As noted above, the final pattern in the target layer 102 may be a pattern in a dielectric layer, a semiconductor substrate, or the like. In an embodiment, the target layer 102 is a low-k dielectric, and the patterned target layer 102 forms a patterned IMD for an interconnect structure. Conductive features such as copper lines, copper vias, and/or cobalt plugs may be formed in the IMD layer using, e.g., a damascene or dual damascene process, whereby the openings formed within the patterned target layer 102 are filled and/or overfilled with a conductive material such as copper, and a planarization process is performed to embed the conductive material within the patterned target layer 102.

Figure 26A:
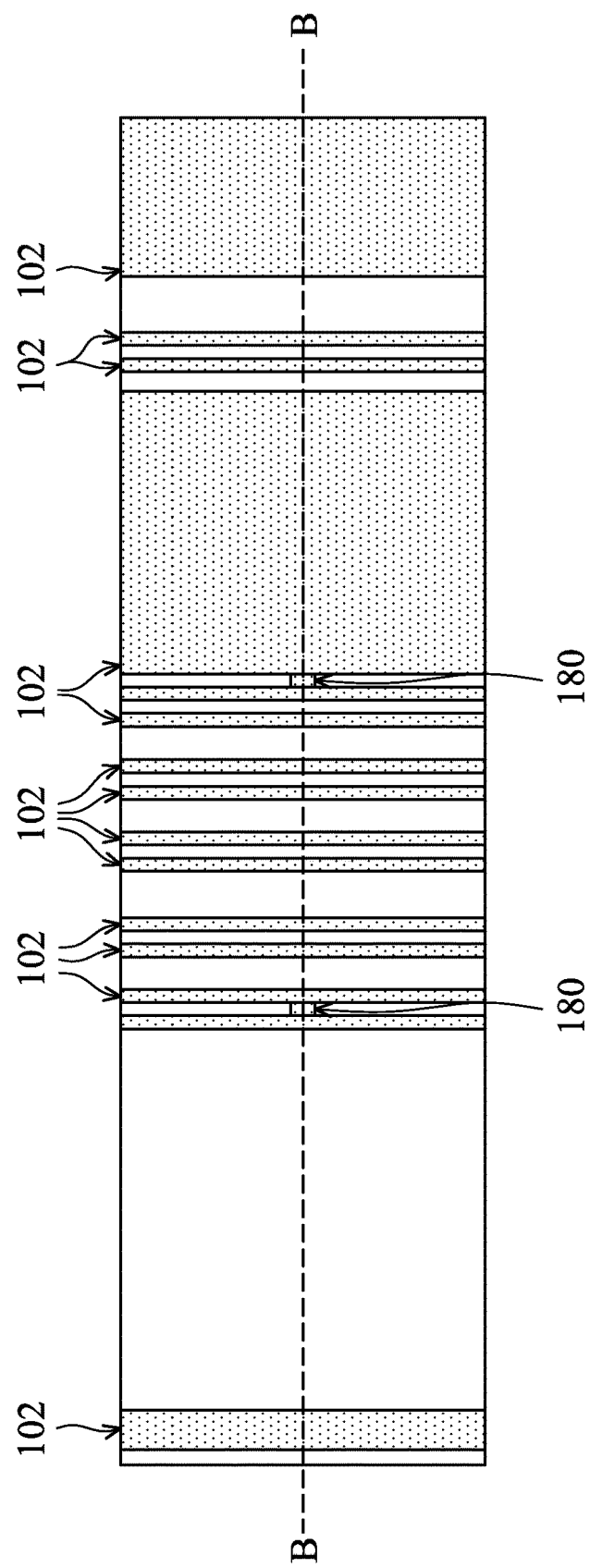
Figure 26B:
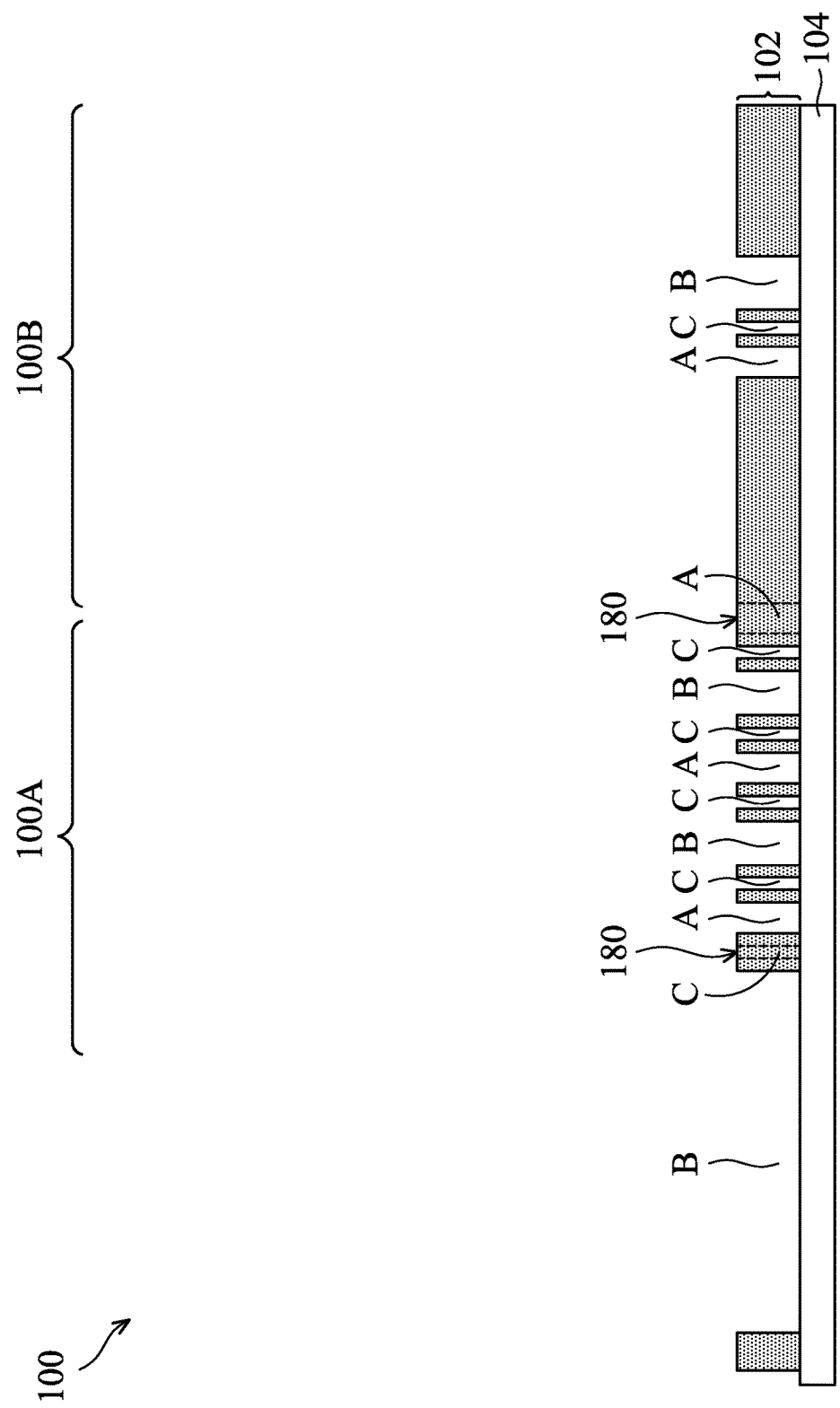

In FIGS. 26A and 26B, excess material from the ARC 106 and hard mask layer 108 is removed. The excess material may be consumed during the etching of the target layer 102. When the ARC 106 and hard mask layer 108 are not consumed, a cleaning process may be performed to remove residual material. In some embodiments, the conductive features may be formed in the lines of the target layer 102 while the ARC 106 and hard mask layer 108 remain, and the ARC 106 and hard mask layer 108 may be removed by the planarization process used to embed the conductive material within the patterned target layer 102.

Embodiments may achieve advantages. Cutting the lines after all of the line patterns are formed may reduce the complexity involved with cutting the lines during intermediate stages of patterning the lines. Further, cutting the lines in a single step may simplify BEOL processing, and may reduce the chances of performing defective cuts.

In an embodiment, a method includes: forming a first mask layer on a substrate; patterning a plurality of first spacers over the first mask layer; forming an anti-reflective layer over the first spacers; forming an etch stop layer over the anti-reflective layer; forming a second mask layer over the etch stop layer; patterning a plurality of openings in the second mask layer, each of the openings overlying respective pairs of the first spacers; extending the openings through the anti-reflective layer and between the respective pairs of the first spacers; forming a reverse material over the second mask layer and in the openings; removing the anti-reflective layer, the etch stop layer, and the second mask layer; and patterning the first mask layer using the first spacers and remaining portions of the reverse material as a first etching mask.

In an embodiment, the patterning the first spacers includes: patterning a plurality of first mandrels over the first mask layer; forming a first spacer layer on sidewalls and tops of the first mandrels; removing horizontal portions of the first spacer layer, with remaining vertical portions of the first spacer layer forming second spacers; removing a portion of the first mandrels; patterning a plurality of second mandrels using the second spacers as a second etching mask; forming a second spacer layer on sidewalls and tops of the second mandrels; and removing horizontal portions of the second spacer layer, with remaining vertical portions of the second spacer layer forming the first spacers. In an embodiment, a pitch between the first spacers is double a pitch between the second spacers in a first region of the substrate. In an embodiment, the portion of the first mandrels are removed before the patterning the second mandrels, and the second mandrels are patterned in a first region of the substrate. In an embodiment, the patterning the second mandrels further includes using the second spacers and the remaining first mandrels in combination as the second etching mask, the remaining first mandrels being in a second region of the substrate different from the first region. In an embodiment, the etch stop layer and the second mask layer having an etch selectivity ratio greater than 3. In an embodiment, the patterning the openings in the second mask layer includes: etching a first subset of the openings in the second mask layer with a first tri-layer photoresist over the etch stop layer and the second mask layer; and after the etching the first subset of the openings in the second mask layer, etching a second subset of the openings in the second mask layer with a second tri-layer photoresist over the etch stop layer and the second mask layer. In an embodiment, the etch stop layer is an oxide, and the second mask layer includes a metal. In an embodiment, the first mask layer includes a metal, and the second mask layer is a dielectric. In an embodiment, the first mask layer is formed over a target layer on the substrate, and the method further includes etching the target layer using the first mask layer as a third etching mask. In an embodiment, the method further includes removing portions of the reverse material not between the respective pairs of the first spacers. In an embodiment, the reverse material formed in the openings does not cross more than one of the openings.

In an embodiment, a method includes: patterning a plurality of first mandrels over a first mask layer; forming a first spacer layer on sidewalls and tops of the first mandrels; removing horizontal portions of the first spacer layer, with remaining vertical portions of the first spacer layer forming first spacers; after removing the horizontal portions of the first spacer layer, depositing a reverse material between the first spacers; and patterning the first mask layer using the first spacers and the reverse material in combination as a first etching mask.

In an embodiment, no reverse material is formed over the first mask layer before removing the horizontal portions of the first spacer layer. In an embodiment, the first mask layer is formed over a target layer, and the method further includes: patterning the target layer using the patterned first mask layer as a second etching mask. In an embodiment, the target layer is a dielectric layer, and the method further includes forming conductive features in the dielectric layer. In an embodiment, the first mandrels are formed over a dielectric layer, the dielectric layer formed over the first mask layer, and the reverse material contacts the dielectric layer after the depositing the reverse material between the first spacers. In an embodiment, the depositing the reverse material between the first spacers includes: forming an anti-reflective layer over the first spacers; forming an etch stop layer over the anti-reflective layer; forming a second mask layer over the etch stop layer; patterning a plurality of openings in the second mask layer, each of the openings overlying respective pairs of the first spacers; extending the openings through the anti-reflective layer and between the respective pairs of the first spacers; and depositing the reverse material in the extended openings.

In an embodiment, a method includes: forming a plurality of spacers over a target layer; forming an anti-reflective layer over the spacers; forming a first mask layer over the anti-reflective layer; forming a first tri-layer photoresist over the first mask layer; patterning the first mask layer with first openings using the first tri-layer photoresist; removing the first tri-layer photoresist; forming a second tri-layer photoresist over the first mask layer; patterning the first mask layer with second openings using the second tri-layer photoresist; removing the second tri-layer photoresist; and depositing a reverse material in the first and second openings, the reverse material being disposed between the spacers.

In an embodiment, the method further includes: patterning the target layer using the spacers and the reverse material in combination as an etching mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first mask layer on a substrate;
   patterning first spacers over the first mask layer;
   forming an anti-reflective layer over the first spacers;
   forming an etch stop layer over the anti-reflective layer;
   forming a second mask layer over the etch stop layer;
   patterning first openings in the second mask layer, each of the first openings overlying respective pairs of the first spacers;
   after patterning the first openings, patterning second openings in the second mask layer, each of the second openings overlying respective pairs of the first spacers;
   extending the first and second openings through the anti-reflective layer and between the respective pairs of the first spacers;
   forming a reverse material over the second mask layer and in the first and second openings;
   removing the anti-reflective layer, the etch stop layer, the second mask layer, and portions of the reverse material; and
   patterning the first mask layer using the first spacers and remaining portions of the reverse material as a first etching mask.

2. The method of claim 1, wherein the patterning the first spacers comprises:
   patterning first mandrels over the first mask layer;
   forming a first spacer layer on sidewalls and tops of the first mandrels;
   removing horizontal portions of the first spacer layer, with remaining vertical portions of the first spacer layer forming second spacers;
   removing a portion of the first mandrels;
   patterning second mandrels using the second spacers as a second etching mask;
   forming a second spacer layer on sidewalls and tops of the second mandrels; and
   removing horizontal portions of the second spacer layer, with remaining vertical portions of the second spacer layer forming the first spacers.

3. The method of claim 2, wherein a pitch between the first spacers is half a pitch between the second spacers in a first region of the substrate.

4. The method of claim 2, wherein the portion of the first mandrels are removed before the patterning the second mandrels, wherein the second mandrels are patterned in a first region of the substrate.

5. The method of claim 4, wherein the patterning the second mandrels further comprises using the second spacers and the remaining first mandrels in combination as the second etching mask, the remaining first mandrels being in a second region of the substrate different from the first region.

6. The method of claim 1, wherein the etch stop layer and the second mask layer having an etch selectivity ratio greater than 3.

7. The method of claim 1, wherein the patterning the first and second openings in the second mask layer comprises:
   etching the first openings in the second mask layer with a first tri-layer photoresist over the etch stop layer and the second mask layer; and
   after the etching the first openings in the second mask layer, etching the second openings in the second mask layer with a second tri-layer photoresist over the etch stop layer and the second mask layer.

8. The method of claim 1, wherein the etch stop layer is an oxide, and wherein the second mask layer comprises a metal.

9. The method of claim 1, wherein the first mask layer comprises a metal, and the second mask layer is a dielectric.

10. The method of claim 1, wherein the first mask layer is formed over a target layer on the substrate, wherein the method further comprises etching the target layer using the first mask layer as a third etching mask.

11. The method of claim 1, further comprising removing portions of the reverse material not between the respective pairs of the first spacers.

12. The method of claim 1, wherein the reverse material formed in the first and second openings does not cross more than one opening of the first and second openings.

13. A method comprising:
   patterning first mandrels over a first mask layer;
   forming a first spacer layer on sidewalls and tops of the first mandrels;
   removing horizontal portions of the first spacer layer, with remaining vertical portions of the first spacer layer forming first spacers;
   after removing the horizontal portions of the first spacer layer, forming a second mask layer over the first spacers;
   patterning openings in the second mask layer, a first subset of the openings being patterned with a first patterning process, a second subset of the openings being patterned with a second patterning process different from the first patterning process;
   depositing a reverse material in the openings of the second mask layer, the reverse material being between the first spacers; and
   patterning the first mask layer using the first spacers and the reverse material in combination as a first etching mask.

14. The method of claim 13, wherein no reverse material is formed over the first mask layer before removing the horizontal portions of the first spacer layer.

15. The method of claim 13, wherein the first mask layer is formed over a target layer, and wherein the method further comprises:
patterning the target layer using the patterned first mask layer as a second etching mask.

16. The method of claim 15, wherein the target layer is a dielectric layer, and wherein the method further comprises forming conductive features in the dielectric layer.

17. The method of claim 15, wherein the first mandrels are formed over a dielectric layer, the dielectric layer formed over the first mask layer, and wherein the reverse material contacts the dielectric layer after the depositing the reverse material between the first spacers.

18. The method of claim 13, wherein the depositing the reverse material between the first spacers comprises:
forming an anti-reflective layer over the first spacers;
forming an etch stop layer over the anti-reflective layer;
forming the second mask layer over the etch stop layer;
patterning the openings in the second mask layer, each of the openings overlying respective pairs of the first spacers;
extending the openings through the anti-reflective layer and between the respective pairs of the first spacers; and
depositing the reverse material in the extended openings.

19. A method comprising:
forming spacers over a target layer;
forming an anti-reflective layer over the spacers;
forming a first mask layer over the anti-reflective layer;
forming a first tri-layer photoresist over the first mask layer;
patterning the first mask layer with first openings using the first tri-layer photoresist;
removing the first tri-layer photoresist;
forming a second tri-layer photoresist over the first mask layer;
patterning the first mask layer with second openings using the second tri-layer photoresist;
removing the second tri-layer photoresist; and
depositing a reverse material in the first and second openings, the reverse material being disposed between the spacers.

20. The method of claim 19, further comprising:
patterning the target layer using the spacers and the reverse material in combination as an etching mask.

* * * * *